(12) United States Patent
Sonehara

(10) Patent No.: US 9,019,748 B2
(45) Date of Patent: Apr. 28, 2015

(54) SEMICONDUCTOR MEMORY DEVICE AND OPERATION METHOD THEREOF

(71) Applicant: Kabushiki Kaisha Toshiba, Minato-ku, Tokyo (JP)

(72) Inventor: Takeshi Sonehara, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/015,622

(22) Filed: Aug. 30, 2013

(65) Prior Publication Data

US 2014/0313813 A1  Oct. 23, 2014

Related U.S. Application Data

(60) Provisional application No. 61/815,197, filed on Apr. 23, 2013.

(51) Int. Cl.
*G11C 11/00* (2006.01)
*G11C 13/00* (2006.01)

(52) U.S. Cl.
CPC ........ *G11C 13/0026* (2013.01); *G11C 13/0002* (2013.01); *G11C 13/0028* (2013.01)

(58) Field of Classification Search
CPC ..................................................... G11C 13/00
USPC .......................................................... 365/148
See application file for complete search history.

(56) References Cited

U.S. PATENT DOCUMENTS

| | | | |
|---|---|---|---|
| 6,975,575 B2 | 12/2005 | Gibson et al. | |
| 7,768,844 B2 | 8/2010 | Takase et al. | |
| 8,406,034 B2 * | 3/2013 | Murooka | 365/148 |
| 2004/0202041 A1 | 10/2004 | Hidenori | |
| 2010/0259962 A1 * | 10/2010 | Yan et al. | 365/51 |
| 2010/0321982 A1 * | 12/2010 | Takagi et al. | 365/148 |
| 2011/0051500 A1 * | 3/2011 | Takagi et al. | 365/148 |
| 2011/0122676 A1 * | 5/2011 | Murooka et al. | 365/148 |
| 2011/0297912 A1 * | 12/2011 | Samachisa et al. | 257/5 |
| 2012/0063245 A1 | 3/2012 | Sonehara | |
| 2012/0147689 A1 * | 6/2012 | Scheuerlein et al. | 365/230.03 |
| 2012/0294073 A1 * | 11/2012 | Lee | 365/163 |
| 2013/0114327 A1 * | 5/2013 | Ikeda et al. | 365/148 |
| 2013/0148400 A1 * | 6/2013 | Murooka | 365/63 |

* cited by examiner

*Primary Examiner* — Son Mai
(74) *Attorney, Agent, or Firm* — Holtz, Holtz, Goodman & Chick PC

(57) ABSTRACT

This semiconductor memory device comprises: a memory cell array including plural bit lines, plural word lines intersecting the plurality of bit lines, and memory cells provided at intersections of the plural bit lines and the plural word lines; and a control unit operative to control a voltage applied to the bit line and the word line. The control unit, when performing a certain operation consecutively on a plurality of the memory cells, selects a first bit line selected from among the plural bit lines and a first word line selected from among the plural word lines to perform a first operation on a first memory cell. Then, in a subsequent second operation following this first operation, selects a second bit line different from the first bit line and a second word line different from the first word line to select a second memory cell.

11 Claims, 21 Drawing Sheets

SEMICONDUCTOR MEMORY DEVICE AND OPERATION METHOD THEREOF

This application is based upon and claims the benefit of priority from the prior U.S. provisional Patent Application No. 61/815,197, filed on Apr. 23, 2013, the entire contents of which are incorporated herein by reference.

FIELD

Embodiments described in the present specification relate to a semiconductor memory device and an operation method thereof.

BACKGROUND

In recent years, resistance varying memory has been receiving attention as a successor candidate of flash memory. Resistance varying memory usually has a cross-point type structure configured having memory cells arranged in a matrix at intersections of a plurality of bit lines and a plurality of word lines intersecting these bit lines, the memory cell comprising a variable resistance element.

Such a cross-point type resistance varying memory is configured such that in a selected memory cell, a voltage is applied to the selected memory cell to cause flow of a current sufficient to cause a resistance change of the variable resistance element, while in an unselected memory cell, a current is prevented from flowing by a selection function of a selection element. An increase in leak current in the unselected memory cell causes malfunction of the resistance varying memory and increases power consumption.

DETAILED DESCRIPTION

A semiconductor memory device in an embodiment described below comprises: a memory cell array including a plurality of bit lines, a plurality of word lines intersecting the plurality of bit lines, and memory cells provided at intersections of the plurality of bit lines and the plurality of word lines; and a control unit operative to control a voltage applied to the bit line and the word line. The control unit, when performing a certain operation consecutively on a plurality of the memory cells, selects a first bit line selected from among the plurality of bit lines and a first word line selected from among the plurality of word lines to perform a first operation on a first memory cell, and then, in a subsequent second operation following this first operation, selects a second bit line different from the first bit line and a second word line different from the first word line to select a second memory cell.

A nonvolatile semiconductor memory device according to an embodiment will be described below with reference to the drawings.

First Embodiment

<Overall System>

Figure 1:
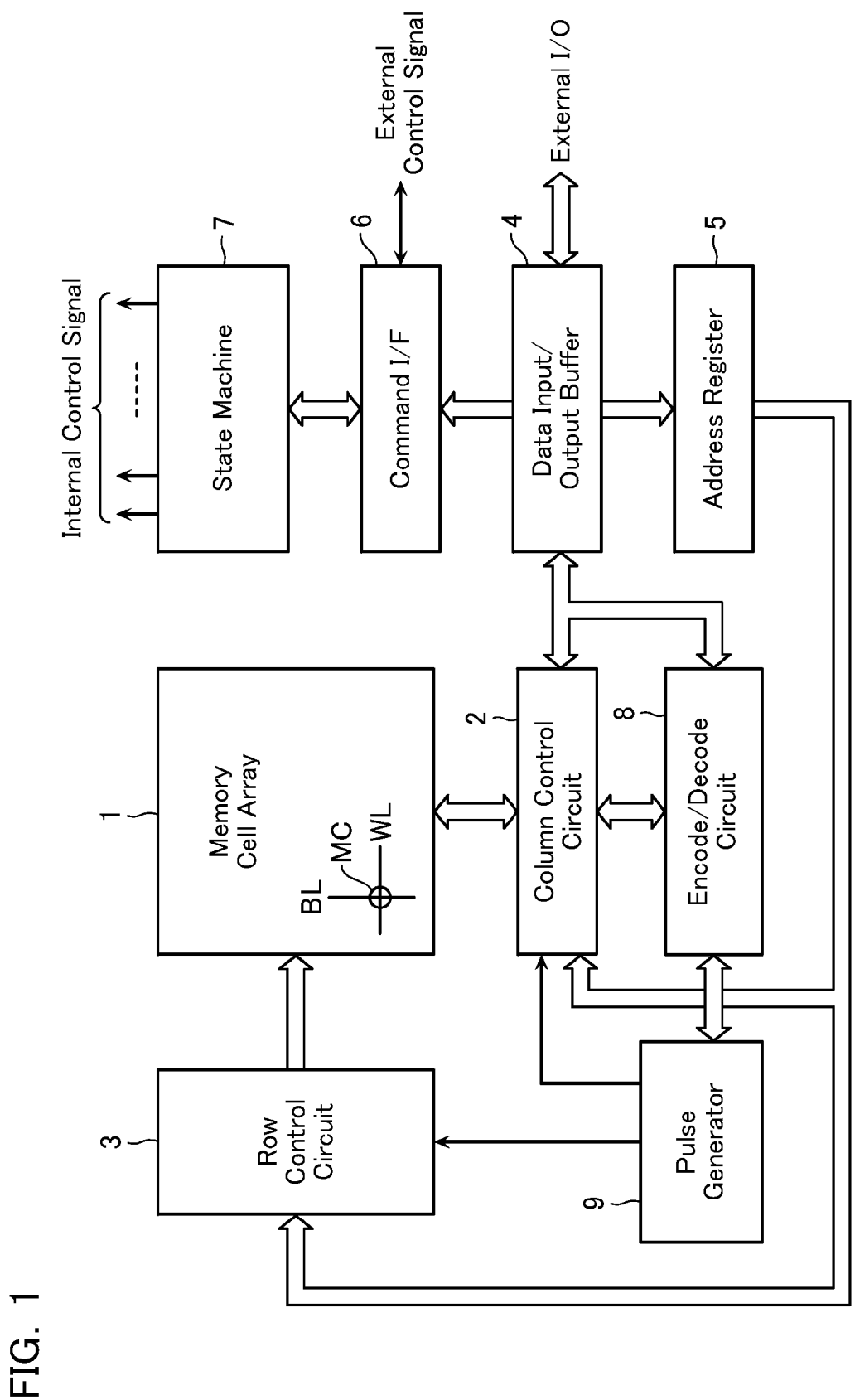
FIG. 1 is an example of a block diagram of a nonvolatile semiconductor memory device according to a first embodiment.

FIG. 1 is an example of a block diagram of a nonvolatile semiconductor memory device according to a first embodiment.

This nonvolatile semiconductor memory device comprises a memory cell array 1 including a plurality of word lines WL, a plurality of bit lines BL intersecting these word lines WL, and a plurality of memory cells MC provided at intersections of these word lines WL and bit lines BL.

A column control circuit 2 is provided at a position adjacent to the memory cell array 1 in a bit line BL direction. The column control circuit 2 controls the bit line BL of the memory cell array 1 to perform data erase of the memory cell MC, data write to the memory cell MC, and data read from the memory cell MC.

In addition, a row control circuit 3 is provided at a position adjacent to the memory cell array 1 in a wordline WL direction. The row control circuit 3 selects the word line WL of the memory cell array 1 to apply a voltage required in data erase of the memory cell MC, data write to the memory cell MC, and data read from the memory cell MC.

A data input/output buffer 4 is connected to an external host not illustrated, via an I/O line, to receive write data, receive an erase command, output read data, and receive address data or command data. The data input/output buffer 4 sends received write data to the column control circuit 2, and receives data read from the column control circuit 2 to be outputted to external. An address supplied to the data input/output buffer 4 from external is sent to the column control circuit 2 and the row control circuit 3 via an address register 5. Moreover, a command supplied to the data input/output buffer 4 from the host is sent to a command interface 6.

The command interface 6 receives an external control signal from the host to determine whether data inputted to the data input/output buffer 4 is write data or a command or an address, and, if a command, receive the data and transfer the data to a state machine 7 as a command signal.

The state machine 7 performs management of this nonvolatile semiconductor memory device overall, and receives a command from the host to perform management of read, write, erase, input/output of data, and so on. Moreover, a portion of the column control circuit 2, the row control circuit 3, the data input/output buffer 4, the address register 5, the command interface 6, and the state machine 7 is sometimes referred to as a "control circuit".

In addition, data inputted to the data input/output buffer 4 from the host is transferred to an encode/decode circuit 8, and an output signal of the encode/decode circuit 8 is inputted to a pulse generator 9. This input signal causes the pulse generator 9 to output a write pulse of a certain voltage and a certain timing. The pulse generated and outputted by the pulse generator 9 is transferred to any wiring line selected by the column control circuit 2 and the row control circuit 3.

<Memory Cell>

Next, the memory cell MC employed in the embodiment shown in FIG. 1 is described.

The memory cell MC of the present embodiment includes a memory element and a non-ohmic element connected in series at the intersection of the word line WL and the bit line BL. The non-ohmic element is an element in which, for example, a metal and a semiconductor, two kinds of semiconductors having a different amount or concentration of added impurity, and so on, have a non-ohmic junction. Examples of the non-ohmic element include the likes of a PN diode, a PIN diode, a PNP element, an NPN element, an NIN element, and a PIP element. Employable as the memory element are a variable resistance element or a phase change element. A variable resistance element refers to an element configured from a material that changes its resistance value due to a voltage, a current, heat, or the like. A phase change element refers to an element configured from a material that changes its physical property such as a resistance value or capacitance, due to a phase change.

Now, phase change (phase transition) includes aspects listed below.

(1) metal-semiconductor transition, metal-insulator transition, metal-metal transition, insulator-insulator transition, insulator-semiconductor transition, insulator-metal transition, semiconductor-semiconductor transition, semiconductor-metal transition, or semiconductor-insulator transition (2) quantum state phase change such as metal-superconductor transition, and so on (3) para magnet-ferromagnet transition, antiferromagnet-ferromagnet transition, ferromagnet-ferromagnet transition, ferrimagnet-ferromagnet transition, or transition configured from a combination of these transitions (4) paraelectric-ferroelectric transition, paraelectric-pyroelectric transition, paraelectric-piezoelectric transition, ferroelectric-ferroelectric transition, antiferroelectric-ferroelectric transition, or transition configured from a combination of these transitions (5) transition configured from a combination of the transitions of (1)~(4) above, for example, transition from metal, insulator, semiconductor, ferroelectric, paraelectric, pyroelectric, piezoelectric, ferromagnet, ferrimagnet, helimagnet, para magnet, or antiferromagnet to ferroelectric ferromagnet, or a reverse transition thereof.

This definition results in a phase change element being included in a variable resistance element, and a variable resistance element in the present embodiment is mainly assumed to mean an element configured from a metal oxide, a metal compound, an organic thin film, carbon, a carbon nanotube, and so on.

Moreover, targeted as a resistance varying memory in the present embodiment are the likes of ReRAM which adopts a variable resistance element as the memory element, or PCRAM, MRAM, and so on, that adopt a phase change element as the memory element.

Figure 2:
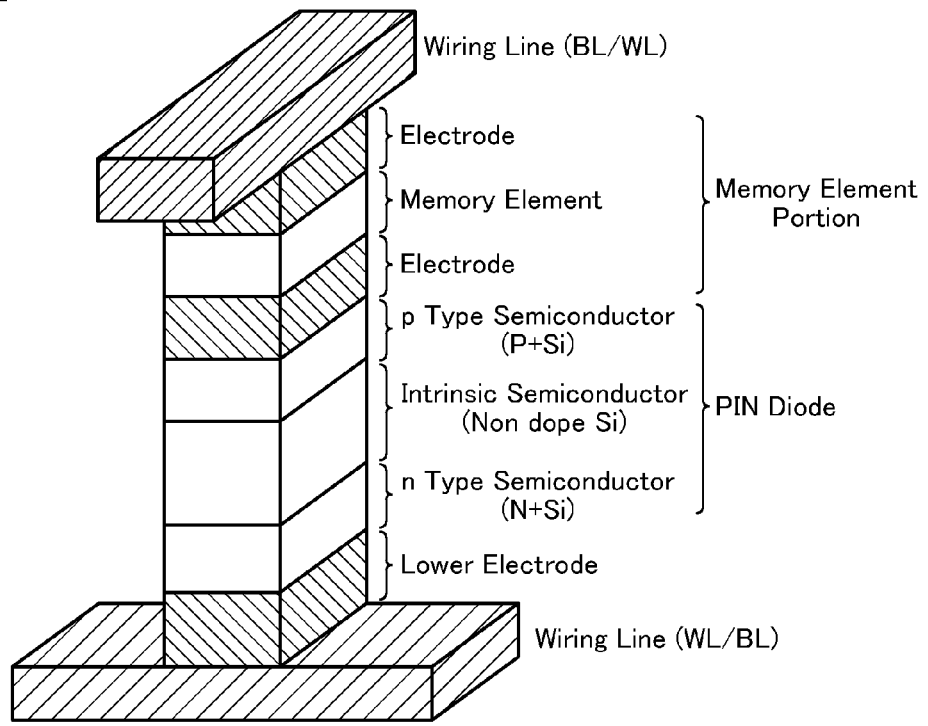
FIG. 2 is an example of a perspective view showing a structure of a memory cell in the nonvolatile semiconductor memory device according to the first embodiment.

FIG. 2 is an example of a perspective view of the memory cell MC in the case where a PIN diode is employed as the non-ohmic element.

As shown in FIG. 2, the memory cell MC is provided at the intersection of the word line WL (or bit line BL) of a lower layer and the bit line BL (or word line WL) of an upper layer. The memory cell MC is formed in a columnar shape having stacked, from the lower layer to the upper layer, a lower electrode, the PIN diode configured from an n type semiconductor (N+Si)/intrinsic semiconductor (Non dope Si)/p type semiconductor (P+Si), and a memory element portion configured from an electrode/memory element/electrode. Note that a film thickness of the PIN diode is set in a range of 50~150 nm.

Figure 3:
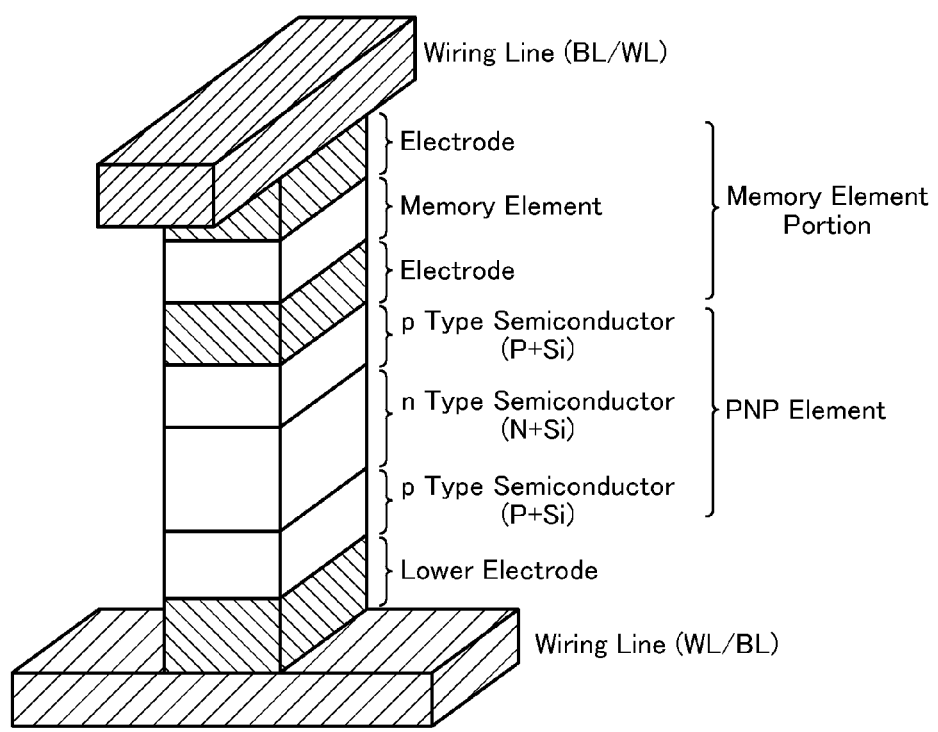
FIG. 3 is an example of a perspective view showing a structure of a memory cell in the nonvolatile semiconductor memory device according to the first embodiment.

FIG. 3 is an example of a perspective view of the memory cell MC in the case where a PNP element is employed as the non-ohmic element.

As shown in FIG. 3, the memory cell MC is provided at the intersection of the word line WL (or bit line BL) of the lower layer and the bit line BL (or word line WL) of the upper layer. The memory cell MC is formed having stacked, from the lower layer to the upper layer, the lower electrode, the PNP element configured from the p type semiconductor (P+Si)/n type semiconductor (N+Si)/p type semiconductor (P+Si), and the memory element portion.

A film thickness of this PNP element too is set in a range of 50~150 nm. Moreover, an NPN element configured from the n type semiconductor (N+Si)/p type semiconductor (P+Si)/n type semiconductor (N+Si) may also be used as the non-ohmic element of the memory cell MC, instead of the PNP element.

As is clear from FIGS. 2 and 3, these memory cells MC can be formed as a cross-point type, hence can realize a large memory capacity by three-dimensional integration. Moreover, due to characteristics of the variable resistance element, these memory cells MC are potentially capable of realizing a high-speed operation exceeding that of flash memory.

Description proceeds below mainly assuming the memory element to be a variable resistance element of ReRAM or the like.

In the case where the memory cell array 1 is three-dimensionally structured, combinations of a positional relationship of the variable resistance element and a rectifier element acting as the non-ohmic element, and an orientation of the rectifier element in the memory cell MC, can be variously selected on a layer-by-layer basis.

Figure 4:
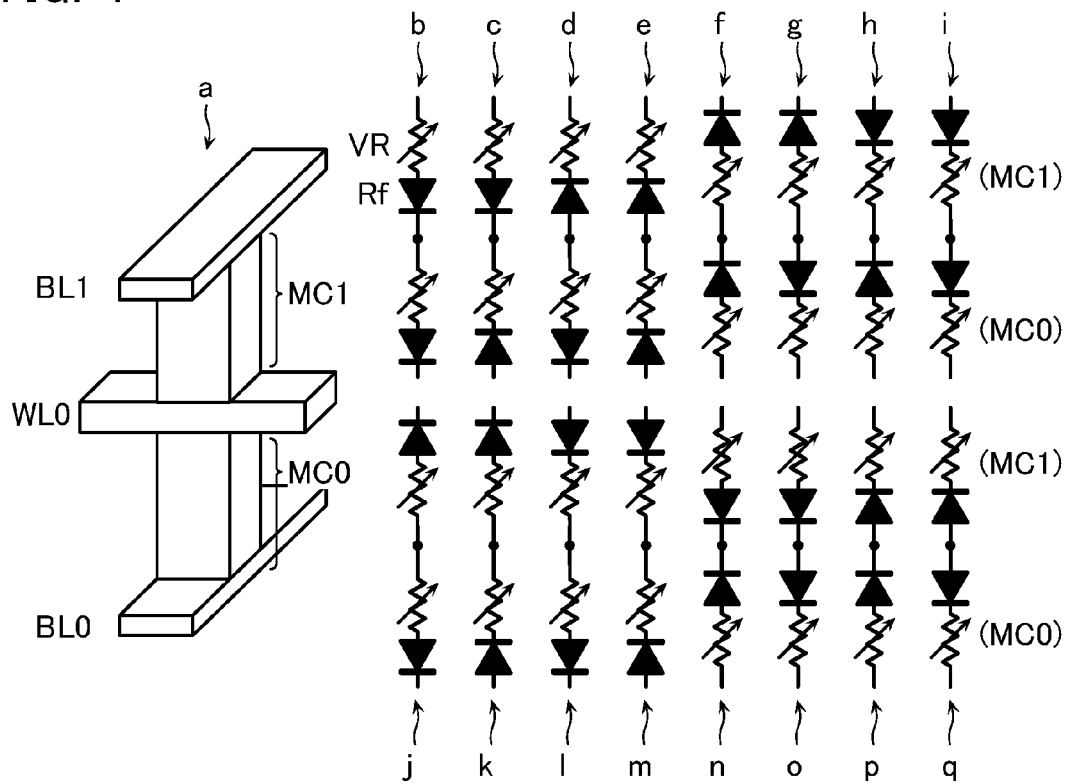
FIG. 4 is a view explaining examples of combinations of placement of a variable resistance element and a rectifier element in the memory cell of the nonvolatile semiconductor memory device according to the first embodiment.

FIG. 4, as shown by a in FIG. 4, is a view explaining examples of patterns of combinations of a memory cell MC0 that belongs to the memory cell array 1 of a lower layer and a memory cell MC1 that belongs to the memory cell array 1 of an upper layer, in the case where a word line WL0 is shared by the memory cells MC0 and MC1. Note that although in FIG. 4, for convenience, the rectifier element is expressed by a symbol for a diode, the rectifier element is not limited to being a diode.

As shown by b~q in FIG. 4, 16 types of patterns, obtained by, for example, inverting a placement relationship of the variable resistance element VR and the rectifier element Rf, or inverting the orientation of the rectifier element Rf, are conceivable as combinations of the memory cell MC0 and the memory cell MC1. These patterns may be selected giving consideration to operation characteristics, an operation system, manufacturing processes, and so on.

<Data Write/Erase Operations>

Next, data write/erase operations on the memory cell MC will be described. Below, a write operation for causing the variable resistance element VR to undergo transition from a high-resistance state to a low-resistance state is called a "setting operation", and an erase operation for causing the variable resistance element VR to undergo transition from a low-resistance state to a high-resistance state is called a "resetting operation". Note that current values, voltage values, and so on, appearing in the description below are merely one example, and differ according to a material, size, and so on, of the variable resistance element VR or rectifier element Rf.

Figure 5:
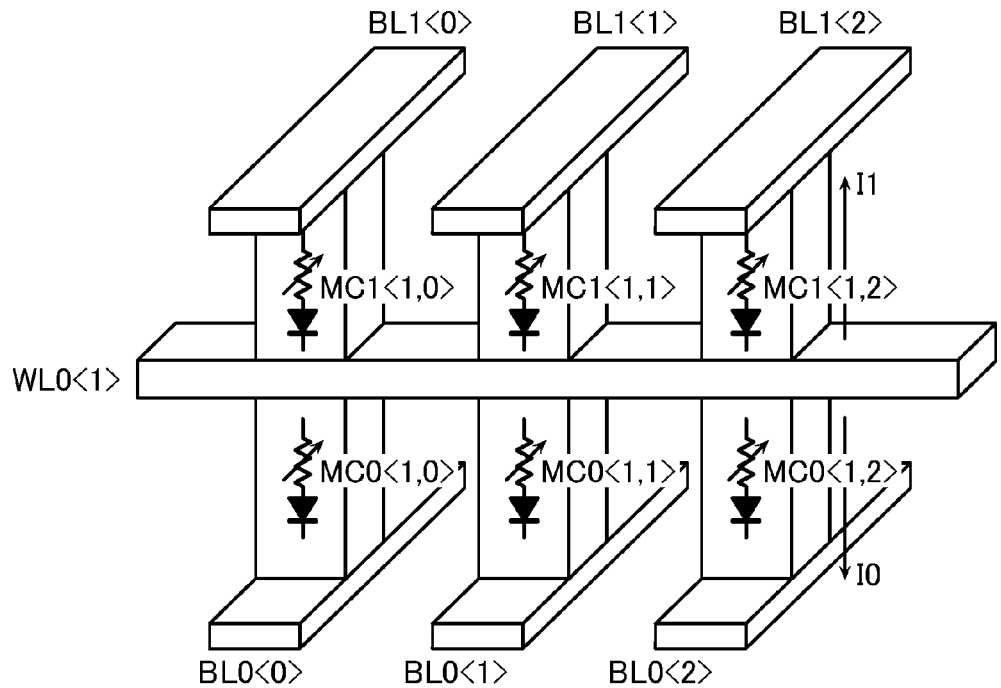
FIG. 5 is an example of a view explaining the situation regarding current flowing in a selected memory cell and an unselected memory cell of the nonvolatile semiconductor memory device according to the first embodiment.

FIG. 5 is an example of a schematic view showing part of the memory cell array 1. In the case of FIG. 5, the memory cell MC0 in the lower layer is provided at the intersection of the bit line BL0 and the word line WL0. The memory cell MC1 in the upper layer is provided at the intersection of the word line WL0 and the bit line BL1. The word line WL0 is shared by the memory cell MC0 and the memory cell MC1.

Moreover, the combination of placement of the memory cells MC0 and MC1 will be described using the pattern of b in FIG. 4. In other words, the memory cell MC0 is stacked in order of the rectifier element Rf and the variable resistance element VR, from the bit line BL0 to the word line WL0. The rectifier element Rf is disposed with an orientation having a direction from the word line WL0 to the bit line BL0 as a forward direction. On the other hand, the memory cell MC1 is stacked in order of the rectifier element Rf and the variable resistance element VR, from the word line WL0 to the bit line BL1. The rectifier element Rf is disposed with an orientation having a direction from the bit line BL1 to the word line WL0 as a forward direction.

Setting/resetting operations in the case where the memory cell MC0<1,1> provided at the intersection of the bit line BL0<1> and the word line WL0<1> is assumed to be a selected memory cell, are here considered.

There are two methods of setting/resetting operations on the memory cell MC, namely a unipolar operation for realizing the setting operation and the resetting operation by bias applications of identical polarity, and a bipolar operation for realizing the setting operation and the resetting operation by bias applications of different polarity.

First, the unipolar operation will be described.

In the setting operation, a current having a current density of $1\times10^5 \sim 1\times10^7$ A/cm$^2$, or a voltage of 1~2 V must be applied to the variable resistance element VR. Therefore, when performing the setting operation on the memory cell MC, a forward direction current must be passed through the rectifier element Rf so that such a certain current or voltage is applied.

In the resetting operation, a current having a current density of $1\times10^3 \sim 1\times10^6$ A/cm$^2$, or a voltage of 1~3 V must be applied to the variable resistance element VR. Therefore, when performing the resetting operation on the memory cell MC, a forward direction current must be passed through the rectifier element Rf so that such a certain current or voltage is applied.

Figure 6:
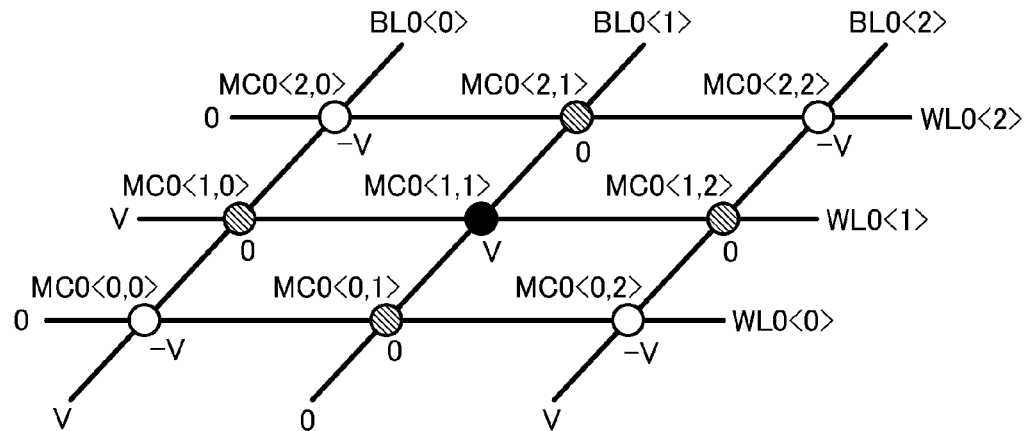
FIG. 6 is an example of a view explaining a bias state when the nonvolatile semiconductor memory device according to the first embodiment is unipolar-operated.

In the unipolar operation, it is only required to apply to the memory cell array 1 a bias such as in FIG. 6, for example.

In other words, as shown in FIG. 6, the selected word line WL0<1> is supplied with a certain voltage V (for example, 3 V), and the other word lines WL0<0> and WL0<2> are supplied with 0 V. Moreover, the selected bit line BL0<1> is supplied with 0 V, and the other bit lines BL0<0> and BL0<2> are supplied with the voltage V.

As a result, the selected memory cell MC0<1,1> is supplied with a potential difference V. The unselected memory cells MC0<0,0>, MC0<0,2>, MC0<2,0>, and MC0<2,2> connected to the unselected word lines WL0<0> and WL0<2> and unselected bit lines BL0<0> and BL0<2> are supplied with a potential difference −V. The other memory cells MC0, in other words, the unselected memory cells (below referred to as "half-selected memory cells") MC0<1,0>, MC0<1,2>, MC0<0,1>, and MC0<2,1> connected only to either the selected word line WL0<1> or the selected bit line BL0<1> are supplied with a potential difference 0.

In this case, the non-osmic element such as a diode having a voltage-current characteristic preventing current from flowing against a reverse bias up to the voltage of −V, but allowing steep current flow with respect to forward bias is needed. Employing such a non-ohmic element in the memory cell MC allows the setting/resetting operations to be performed only on the selected memory cell MC0<1,1>.

Next, the bipolar operation will be described.

In the case of the bipolar operation, basically, the following points must be considered, namely that (1) contrary to the case of the unipolar operation, current is passed bi-directionally in the memory cell MC, (2) the operation speed, operation current, and operation voltage change from those of the unipolar operation, and (3) a bias is applied also to the half-selected memory cells MC.

Figure 7:
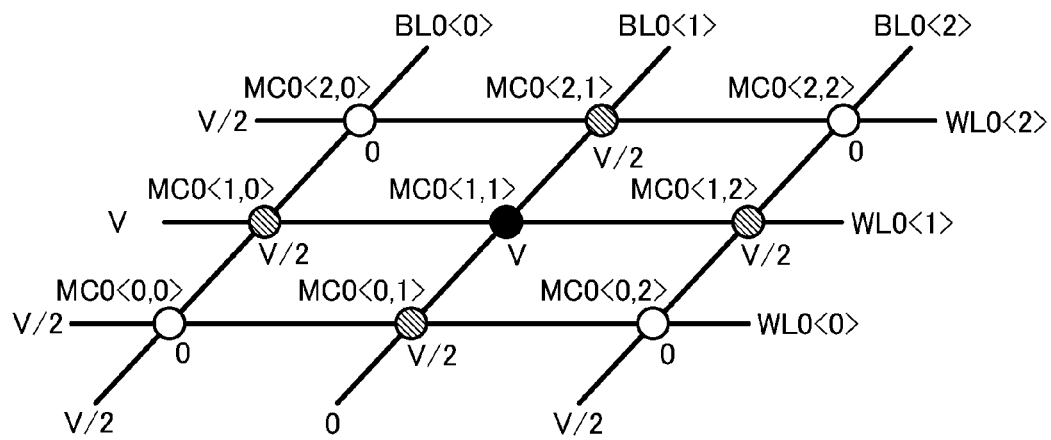
FIG. 7 is an example of a view explaining a bias state when the nonvolatile semiconductor memory device according to the first embodiment is bipolar-operated.

FIG. 7 is an example of a view showing a state of bias application to the memory cell array 1 during the bipolar operation. In the bipolar operation, it is only required to apply to the memory cell array 1 a bias such as in FIG. 7, for example.

In other words, as shown in FIG. 7, the selected word line WL0<1> is supplied with a certain voltage V (for example, 3 V), and the other word lines WL0<0> and WL0<2> are supplied with a voltage V/2 (for example, 1.5 V). Moreover, the selected bit line BL0<1> is supplied with 0 V, and the other bit lines BL0<0> and BL0<2> are supplied with the voltage V/2.

As a result, the selected memory cell MC0<1,1> is supplied with a potential difference V. The unselected memory cells MC0<0,0>, MC0<0,2>, MC0<2,0>, and MC0<2,2> connected to the unselected word lines WL0<0> and WL0<2> and unselected bit lines BL0<0> and BL0<2> are supplied with a potential difference 0. The other memory cells MC0, in other words, the unselected memory cells (half-selected memory cells) MC0<1,0>, MC0<1,2>, MC0<0,1>, and MC0<2,1> connected only to either the selected word line WL0<1> or the selected bit line BL0<1> are supplied with a potential difference V/2.

Therefore, in the bipolar operation, a non-ohmic element having characteristics in which a current flows at the potential difference V but a current does not flow at the potential difference V/2 or less is needed.

As described above, when a selected memory cell is selected for the setting operation or the resetting operation, a certain current flows in that selected memory cell, regardless of whichever of the unipolar operation and the bipolar operation is adopted. For example, as shown in FIG. 6, the case is assumed where the memory cell MC0<1,1> is selected as the selected memory cell in the setting operation or the resetting operation. In this case, when application of a voltage to the selected memory cell MC0<1,1> has finished after completion of the setting operation or the resetting operation in the selected memory cell MC0<1,1>, current flowing in the selected memory cell MC0<1,1> ideally becomes zero instantaneously. However, regarding the actual selected memory cell MC0<1,1>, a reverse recovery current sometimes flows in the selected memory cell MC0<1,1>, although only for a short time, even after voltage application has finished. Moreover, immediately after voltage application to the selected memory cell has finished, a residual charge sometimes remains in, for example, an intrinsic semiconductor portion of a PIN diode or a junction portion of a PN diode. This residual charge is prominent particularly in the case where the selector is the diode and current is increased using an impact ionization phenomenon.

The inventors of the present invention focused on the fact that these reverse recovery current or residual charge are an obstacle to the setting operation or resetting operation in a memory cell next targeted for the setting operation or resetting operation. That is, let us suppose a case where while a reverse recovery current is flowing in the memory cell MC0<1,1> after completion of the setting operation or resetting operation, memory cells which were half-selected memory cells at the time the memory cell MC0<1,1> was being selected (for example, the memory cells MC0<1,0>, MC0<1,2>, MC0<0,1>, or MC0<2,1> in FIG. 6) are newly selected and the setting operation or resetting operation are newly started. In this case, it is possible to cause a malfunction in the setting operation or resetting operation or an increase in power consumption. This is because effects of the reverse recovery current or of the residual charge flowing in the immediately prior selected memory cell MC0<1,1> cause a potential of the selected bit line BL or selected word line WL to change.

Figure 8:
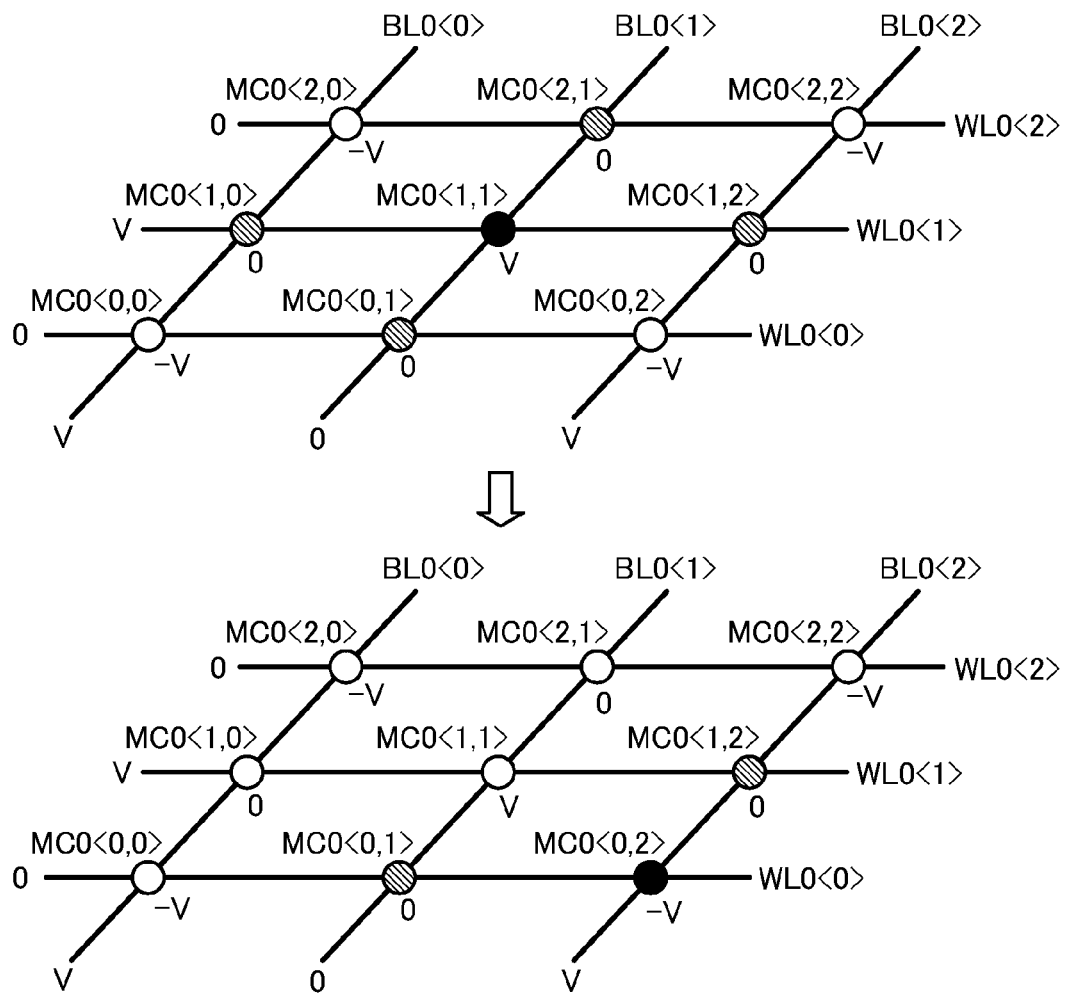
FIG. 8 is a conceptual diagram showing an example of an operation method in the case of performing a setting operation or a resetting operation consecutively on a plurality of the memory cells in the nonvolatile semiconductor memory device according to the first embodiment.
Figure 9A:
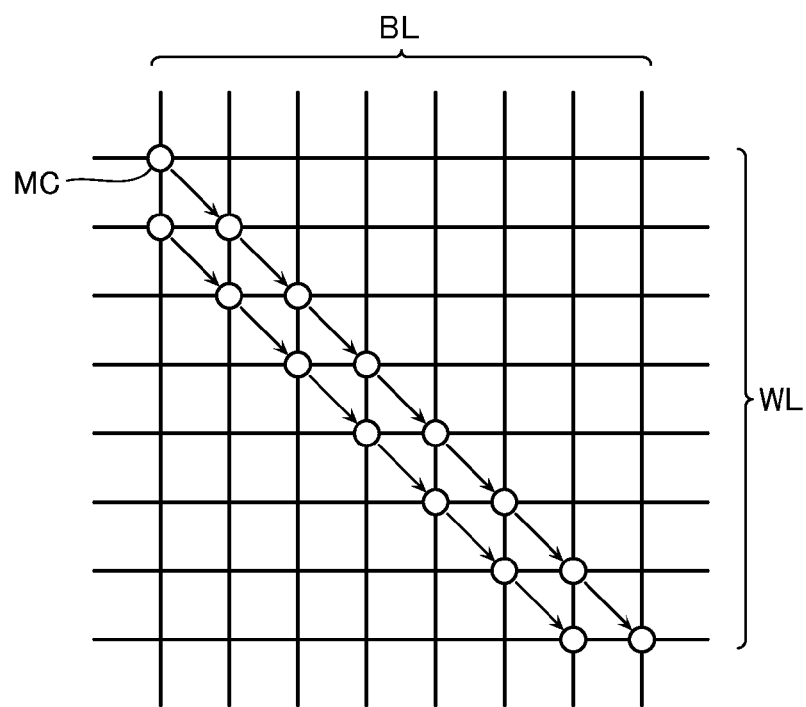
FIGS. 9A and 9B are conceptual diagrams showing an example of an operation method in the case of performing a setting operation or a resetting operation consecutively on a plurality of the memory cells in the nonvolatile semiconductor memory device according to the first embodiment.

Accordingly, the semiconductor memory device of the present embodiment is configured to, when performing the setting operation or the resetting operation consecutively on a plurality of the memory cells MC, execute an operation such as shown in FIG. 8. Now, "consecutively" refers here to performing the next setting operation or resetting operation within a time that the reverse recovery current and so on of the previous setting operation or resetting operation is flowing, and is a time in the order of roughly nsec~μsec. That is, the control circuit, after selecting the memory cell MC0<1,1> and after the setting operation or resetting operation on that memory cell MC0<1,1> have been completed, does not select the above-mentioned kinds of half-selected memory cells (for example, the memory cells MC0<1,0>, MC0<1,2>, MC0<0, 1>, or MC0<2,1> in FIG. 6) in the next setting operation and resetting operation. Instead, the control circuit selects as the selected memory cell a memory cell MC connected to a different bit line BL and word line WL from the bit line BL0<1> and word line WL0<1> to which the memory cell MC0<1,1> is connected. As an example, as shown in FIG. 8, the control circuit can select the memory cell MC0<0,2> connected to the bit line BL0<2> and word line WL0<0> adjacent to the bit line BL0<1> and word line WL0<1> to which the memory cell MC0<1,1> is connected. Then, when selection is similarly repeated, as shown in FIG. 9A, the selected memory cell is sequentially selected so as to move in an oblique direction with respect to a longer direction of the bit line BL and a longer direction of the word line WL in the memory cell array. Now, in the case that a wiring line width and a wiring line spacing of the word lines WL and the bit lines BL are equal, the selected memory cell could be said to move obliquely in a 45 degree direction with respect to the longer direction of the bit line BL and the longer direction of the word line WL in the memory cell array.

Note that when the selected memory cell moves in an oblique direction as described above, the same kind of operation may be performed on the sequentially-selected selected memory cell, or a different operation may be included. That is, the control circuit, when performing a first operation, a second operation, . . . , an n-th operation (n is an integer not less than 3) on a plurality of the memory cells, sequentially selects the selected memory cell such that the selected memory cell moves in an oblique direction with respect to the longer directions of the bit lines and word lines. Now, the first operation to the n-th operation are, for example, the setting operation, the resetting operation, a read operation, and so on.

Advantages

In this way, according to the present embodiment, when the setting operation or resetting operation for which a certain memory cell has been selected as a target is completed, an unselected memory cell not sharing either the bit line BL or the word line WL with that memory cell is selected in the next setting operation or resetting operation. This makes it possible to shift to the next setting operation or resetting operation, without receiving effects of the likes of the reverse recovery current or the residual charge flowing in the immediately prior selected memory cell. It is therefore possible to prevent mistaken operation in the setting operation or resetting operation, suppress an increase in power consumption too, and, moreover, quicken operation speed. Note that although the operations shown in FIG. 8 and FIG. 9A were described above as being performed in the case of the setting operation and resetting operation being performed, similar operations can be performed also in the read operation. However, in the read operation, voltages applied to each of the wiring lines are lower than those in the setting operation and the resetting operation, hence a different method of operation may also be adopted.

Figure 9B:
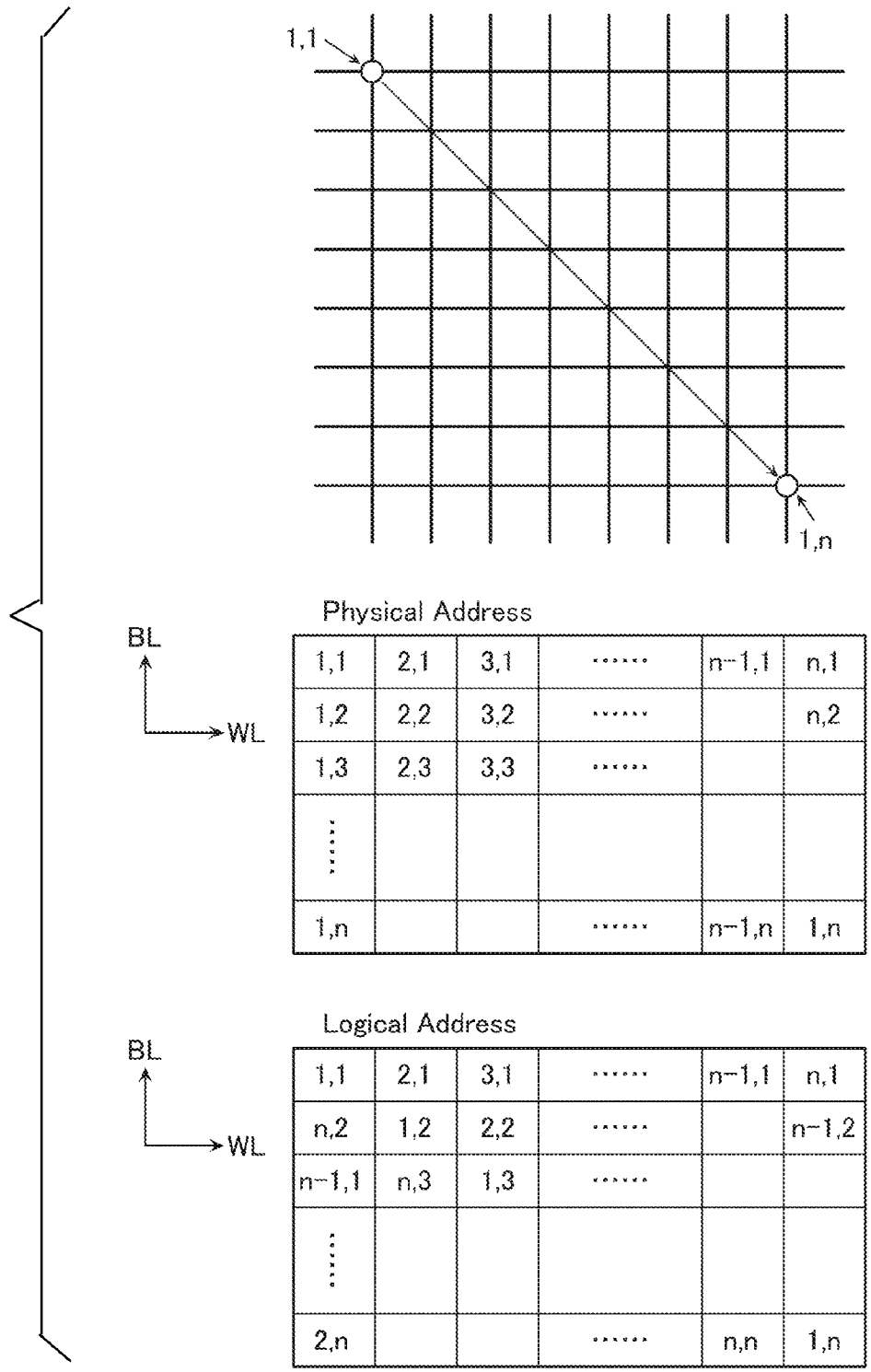

Moreover, conversion between a physical address and a logical address in order to select the memory cells according to a fixed rule, is easy. For example, as shown in FIG. 9B, address conversion can be performed such that, in the case where the physical address is allocated sequentially along the longer direction of the bit line BL in the memory cell array, the logical address is allocated sequentially in an oblique direction with respect to the longer direction of the bit line BL in the memory cell array. For example, n pieces of data are assumed to be one page. Then, data from external having a data length of n is inputted from a host or the like, and the control circuit executes the setting operation or resetting operation according to an order of numerical value of the logical address ((1,1), (1,2), (1,3), (1,4), ..., (1,n)), thereby storing the data in respective memory cells. The next one page's worth of data having a data length of n is inputted from the host or the like, and the control circuit executes the setting operation or resetting operation according to an order of numerical value of the logical address ((2,1), (2,2), (2,3), (2,4), ..., (2,n)), thereby storing the data in respective memory cells.

Second Embodiment

Next, a semiconductor memory device according to a second embodiment will be described with reference to FIG. 10. A configuration of the semiconductor memory device is substantially similar to that of the first embodiment. Moreover, the fact that the control circuit selects a certain memory cell and, after the setting operation or resetting operation on that memory cell has been completed, the control circuit, in the next setting operation or resetting operation, newly selects as the selected memory cell a memory cell MC of which both the bit line BL and the word line WL are different, is also similar to in the first embodiment.

Figure 10:
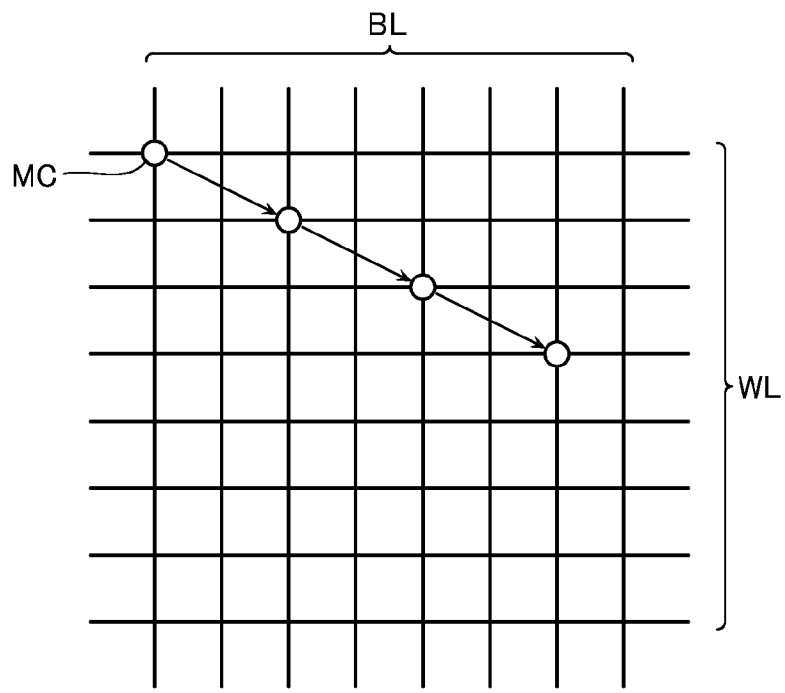
FIG. 10 is a conceptual diagram showing an example of an operation method in the case of performing a setting operation or a resetting operation consecutively on a plurality of memory cells in a nonvolatile semiconductor memory device according to a second embodiment.

However, as shown in FIG. 10, the second embodiment is different from the first embodiment in that, in the second embodiment, the control circuit selects the bit line BL two apart from the immediately prior selected bit line BL, and selects the word line WL immediately adjacent to the immediately prior selected word line WL. This operation too allows similar advantages to those of the first embodiment to be displayed.

In addition, separating the selected memory cell from the immediately prior selected memory cell allows an effect of heat generated from the immediately prior selected memory cell to be reduced. Moreover, since the memory cells are selected according to a fixed rule, conversion between a physical address and a logical address is easy.

Third Embodiment

Next, a semiconductor memory device according to a third embodiment will be described with reference to FIG. 11. A configuration of the semiconductor memory device is substantially similar to that of the first embodiment. Moreover, the fact that the control circuit selects a certain memory cell and, after the setting operation or resetting operation on that memory cell has been completed, the control circuit, in the next setting operation or resetting operation, selects as the selected memory cell a memory cell MC of which both the bit line BL and the word line WL are different, is also similar to in the first embodiment.

Figure 11:
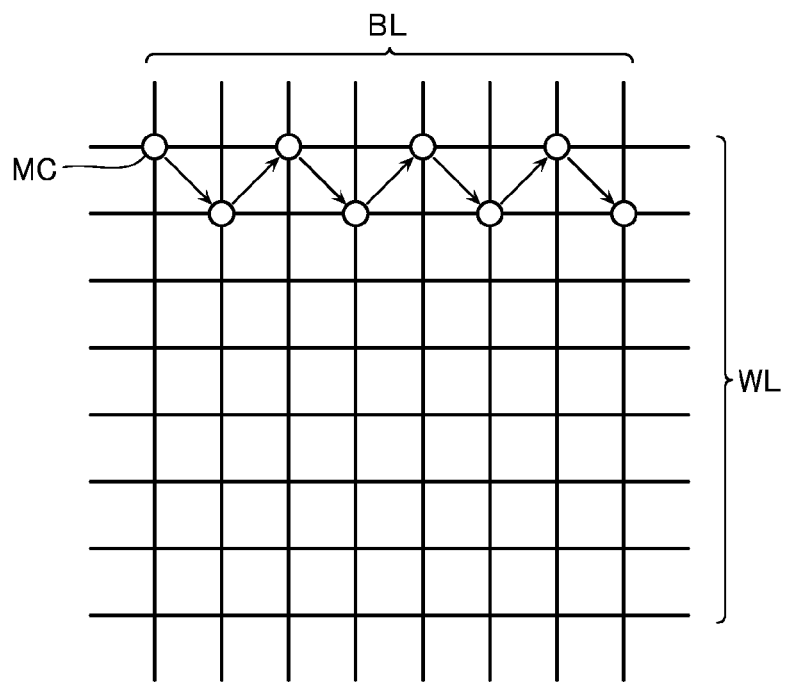
FIG. 11 is a conceptual diagram showing an example of an operation method in the case of performing a setting operation or a resetting operation consecutively on a plurality of memory cells in a nonvolatile semiconductor memory device according to a third embodiment.

However, as shown in FIG. 11, the third embodiment is different from the first embodiment in that, in the third embodiment, the control circuit sequentially selects the memory cells in a so-called zigzag shape with respect to the longer directions of the bit line BL and the word line WL. Specifically, the control circuit selects the memory cell positioned obliquely below the immediately prior selected memory cell MC, similarly to in the first embodiment. After the operation on that memory cell has been completed, the control circuit next selects the memory cell positioned obliquely above that memory cell as viewed from that memory cell. The control circuit repeats this, and, as a result, controls such that the memory cells are selected in a zigzag shape. This operation too allows similar advantages to those of the first embodiment to be displayed.

Fourth Embodiment

Next, a semiconductor memory device according to a fourth embodiment will be described with reference to FIG. 12. A configuration of the semiconductor memory device is substantially similar to that of the first embodiment. Moreover, the fact that the control circuit selects a certain memory cell and, after the setting operation or resetting operation on that memory cell has been completed, the control circuit, in the next setting operation or resetting operation, selects as the selected memory cell a memory cell MC of which both the bit line BL and the word line WL are different, is also similar to in the first embodiment.

Figure 12:
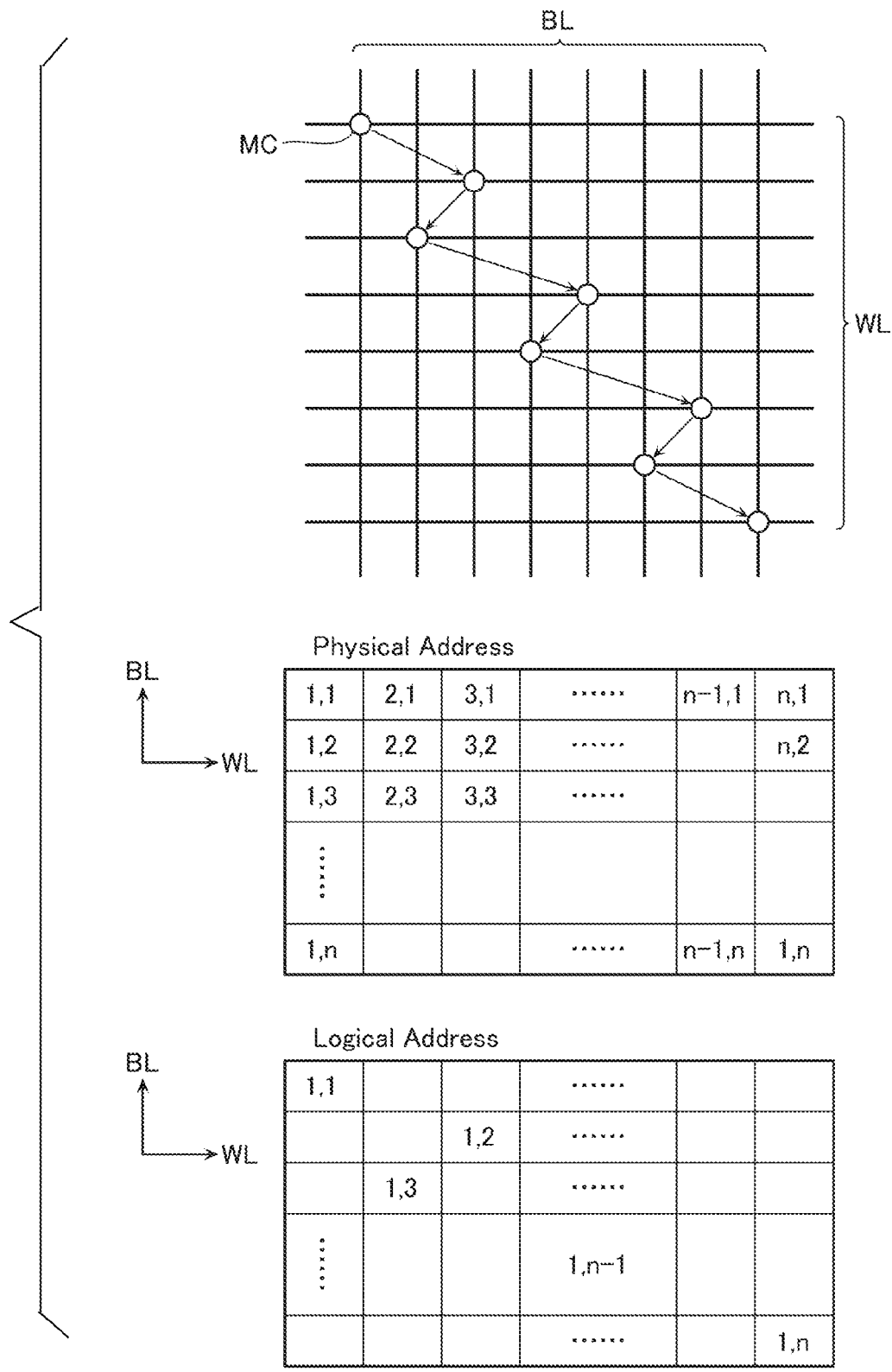
FIG. 12 is a conceptual diagram showing an example of an operation method in the case of performing a setting operation or a resetting operation consecutively on a plurality of memory cells in a nonvolatile semiconductor memory device according to a fourth embodiment.

However, as shown in FIG. 12, the fourth embodiment is different from the first embodiment in that, in the fourth embodiment, the state machine 7 comprises a table defining an order of performing the setting operation or resetting operation. For example, as shown in a lower part of FIG. 12, a logical address is allocated to a physical address. The control circuit executes the setting operation or resetting operation according to an order of numerical value of the logical address ((1,1), (1,2), (1,3), (1,4), ..., (1,n), ...). FIG. 12 shows the case of the selected memory cell MC moving as shown in a drawing in an upper part of FIG. 12, but the spirit of the invention is not limited to this. Now, the table can be stored in a ROM region of a nonvolatile semiconductor memory device. Moreover, the table may also be provided to an external memory controller, a host, or the like.

Fifth Embodiment

Figure 13A:
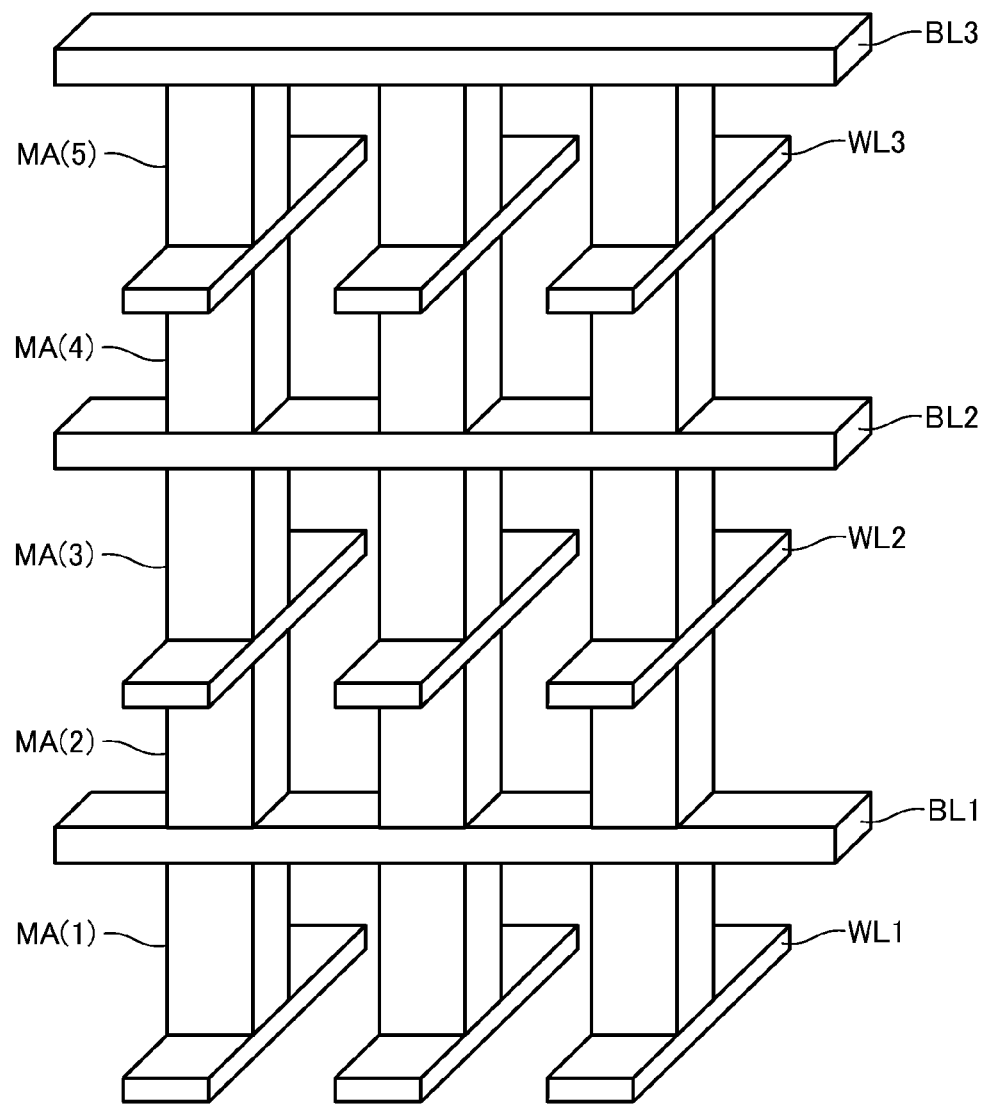
FIG. 13A is an example of a perspective view showing a structure of a memory cell in a nonvolatile semiconductor memory device according to a fifth embodiment.
Figure 13B:
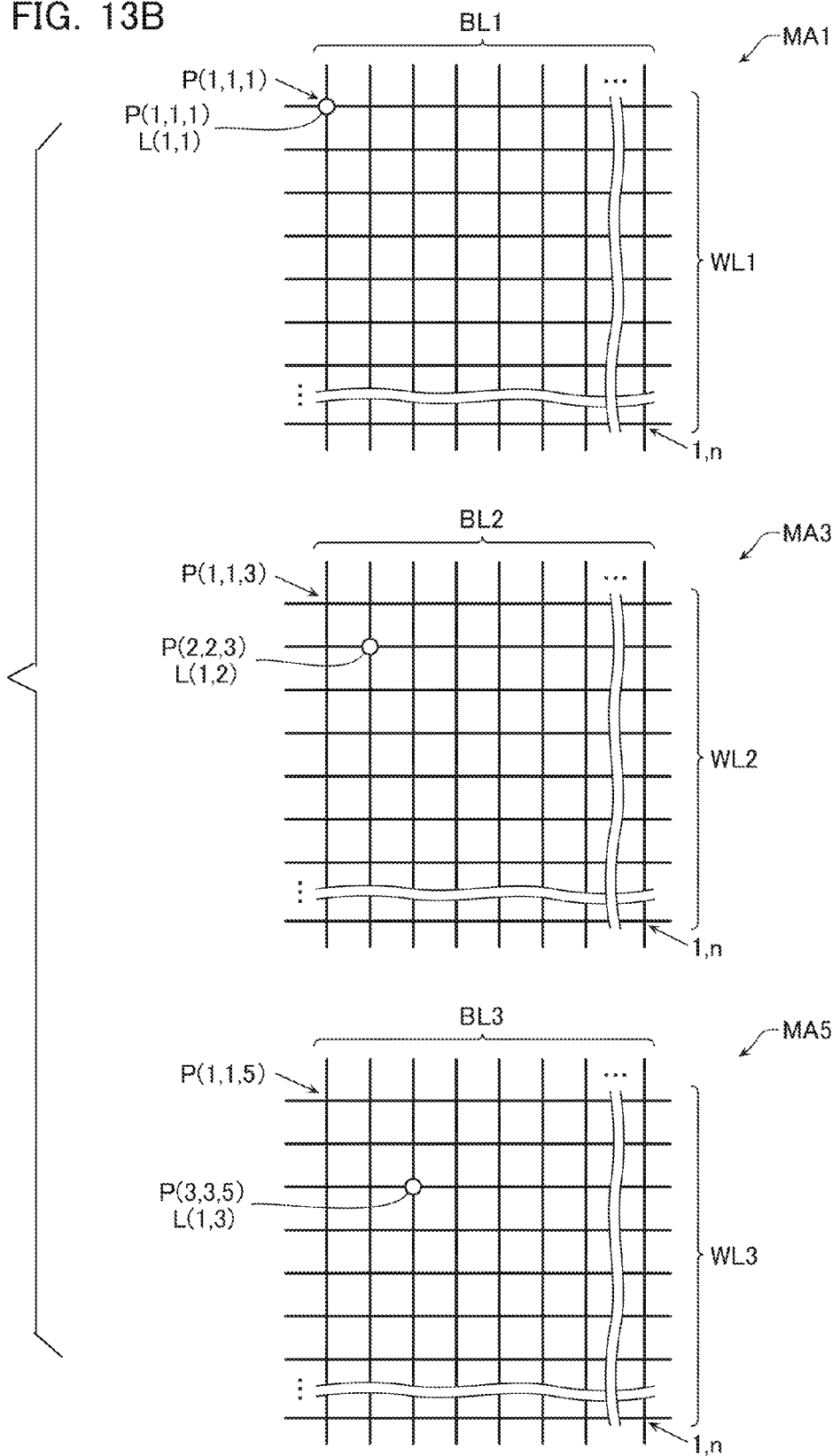
FIGS. 13B and 13C are conceptual diagrams showing an example of an operation method in the case of performing a setting operation or a resetting operation consecutively on a plurality of memory cells in the nonvolatile semiconductor memory device according to the fifth embodiment.
Figure 13C:
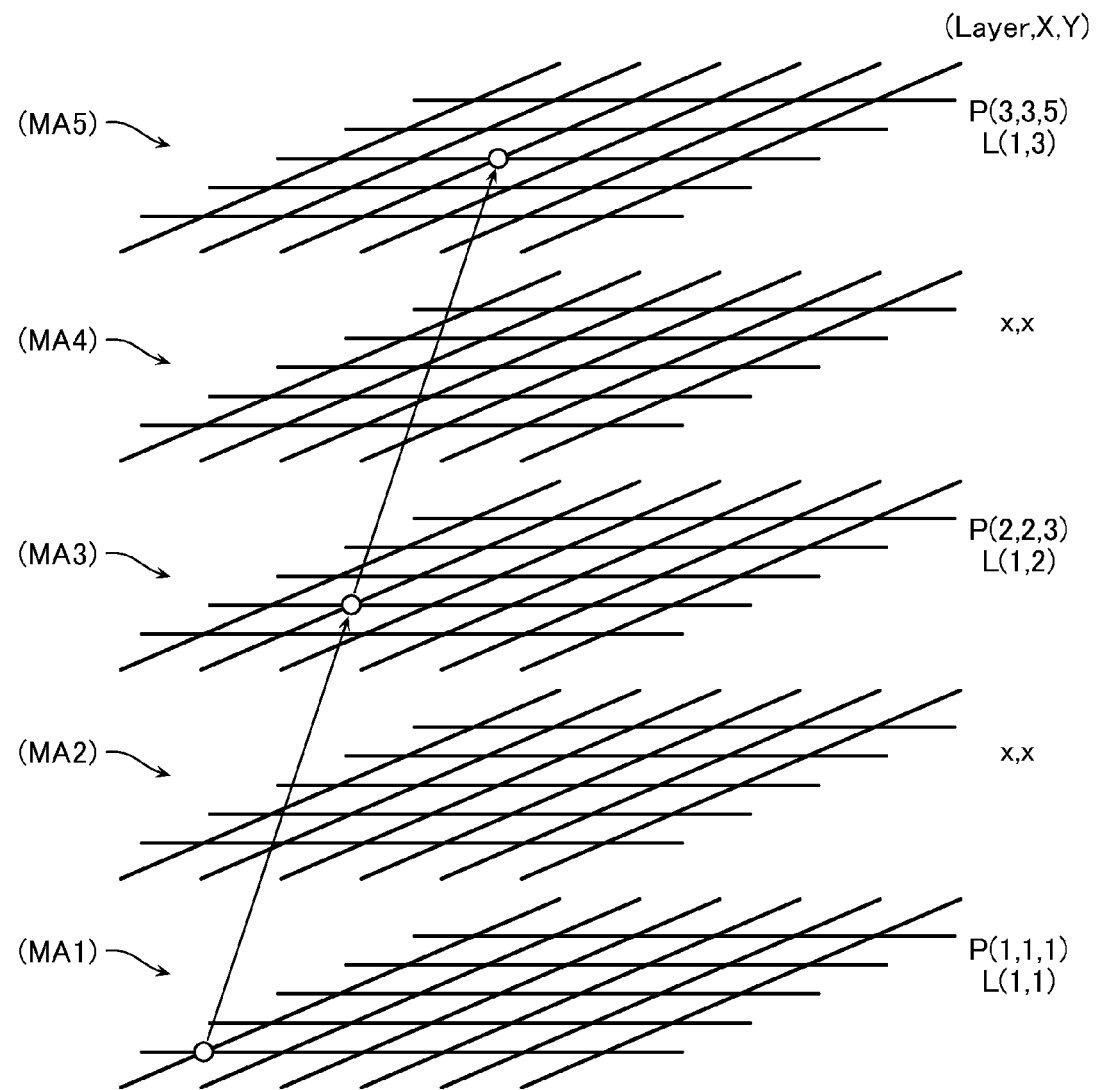

Next, a semiconductor memory device according to a fifth embodiment will be described with reference to FIGS. 13A~13D. A schematic configuration of the semiconductor memory device is substantially similar to that of the first embodiment (FIG. 1). However, in this embodiment, the memory cell array 1 is assumed to include a plurality of memory layers MA by a stacked structure of the kind shown in FIG. 13A, for example. For the sake of simplicity, FIG. 13A illustrates only five memory layers MA(1)~MA(5), but the description below proceeds assuming a similar structure to be repeated in a stacking direction. That is, the number of memory layers MA in the stacking direction is arbitrary and not limited to five as shown in FIG. 13A. Moreover, each of the memory layers MA includes a plurality of word lines WL, a plurality of bit lines BL intersecting these word lines WL, and a plurality of memory cells MC provided at intersections of these word lines WL and bit lines BL. That is, in each of the memory layers MA, the memory cells MC could be said to be disposed in a matrix as shown in FIG. 13C.

The first through fourth embodiments described examples where a memory cell existing in a certain memory layer MA(i) is selected and, after the setting operation or resetting operation on that memory cell has been completed, a separate memory cell existing in the same memory layer MA(i) is selected as the selected memory cell in the next setting operation and resetting operation. In contrast, in this fifth embodiment, the control circuit is configured to select a certain memory cell in, for example, the memory layer MA(1) and, after the setting operation or resetting operation on that memory cell has been completed, select a memory cell in a different memory layer MA (for example, the memory layer MA(3)) in the next setting operation and resetting operation.

Note that in the description below, a physical address of a certain memory cell in one memory layer MA is expressed by an X axis and a Y axis along a surface of a semiconductor substrate, and a Z axis orthogonal to these X and Y axes. For example, the physical address of the memory cell at top left of the memory layer MA(1) is expressed by an XYZ coordinate as P(1,1,1). The physical address of the memory cell at bottom right of the memory layer MA(2) is expressed as P(k,k,2) (in the case where the number of word lines and bit lines are each k, and k is an integer not less than 2).

On the other hand, a logical address is expressed only by XY coordinates without employing a Z coordinate, as for example L(1,1), assuming the memory cells in a plurality of layers of the memory layers MA to be located virtually on a single planar surface. However, this is merely one example for convenience of description, and ways of allocating the physical address and the logical address are not limited to this.

An operation in the case of sequentially selecting the memory cell in the Z direction in the present embodiment will be described with reference to FIGS. 13B and 13C. When sequentially selecting the memory cell in the Z direction, as shown in FIGS. 13B and 13C, the memory cell having the physical address P(1,1,1) (logical address L(1,1)) in the memory layer MA (1) is for example selected and the memory layer MA(3) is next selected. In this case, the memory cell having the physical address P(2,2,3) (logical address L(1,2)) existing obliquely above the memory cell having the physical address P(1,1,1) in the memory layer MA(1) as viewed from the memory cell having the physical address P(1,1,1) in the memory layer MA(1), is selected. In the case where the memory layer MA(5) is next selected, the memory cell having the physical address P(3,3,5) (logical address L(1,3)) existing obliquely above the memory cell having the physical address P(2,2,3) in the memory layer MA(3) as viewed from the memory cell having the physical address P(2,2,3) in the memory layer MA(3), is selected. Note that the memory cell having the physical address P(1,1, 1) in the memory layer MA(1) is allocated with the logical address L(1,1), the memory cell having the physical address P(2,2,3) in the memory layer MA(3) is allocated with the logical address L(1,2), and the memory cell having the physical address P(3,3,5) in the memory layer MA(5) is allocated with the logical address L(1,3). Thereafter, one memory cell at a time is selected from among the stacked plurality of memory layers MA, in a similar manner.

The memory layer MA(1) and the memory layer MA(3) sandwich between them the memory layer MA(2), hence do not share either the bit line BL or the word line WL. The same applies to the memory layers MA(3) and MA(5). Therefore, adopting a selection order of the above-described kind makes it possible to shift to the next setting operation or resetting operation, without receiving effects of the likes of the reverse recovery current or the residual charge flowing in the immediately prior selected memory cell. A selection procedure shown in FIGS. 13B and 13C is merely one example, and various orders for the selection order of the memory layer MA may be adopted, as long as effects of the likes of the reverse recovery current or the residual charge are limited.

Figure 13D:
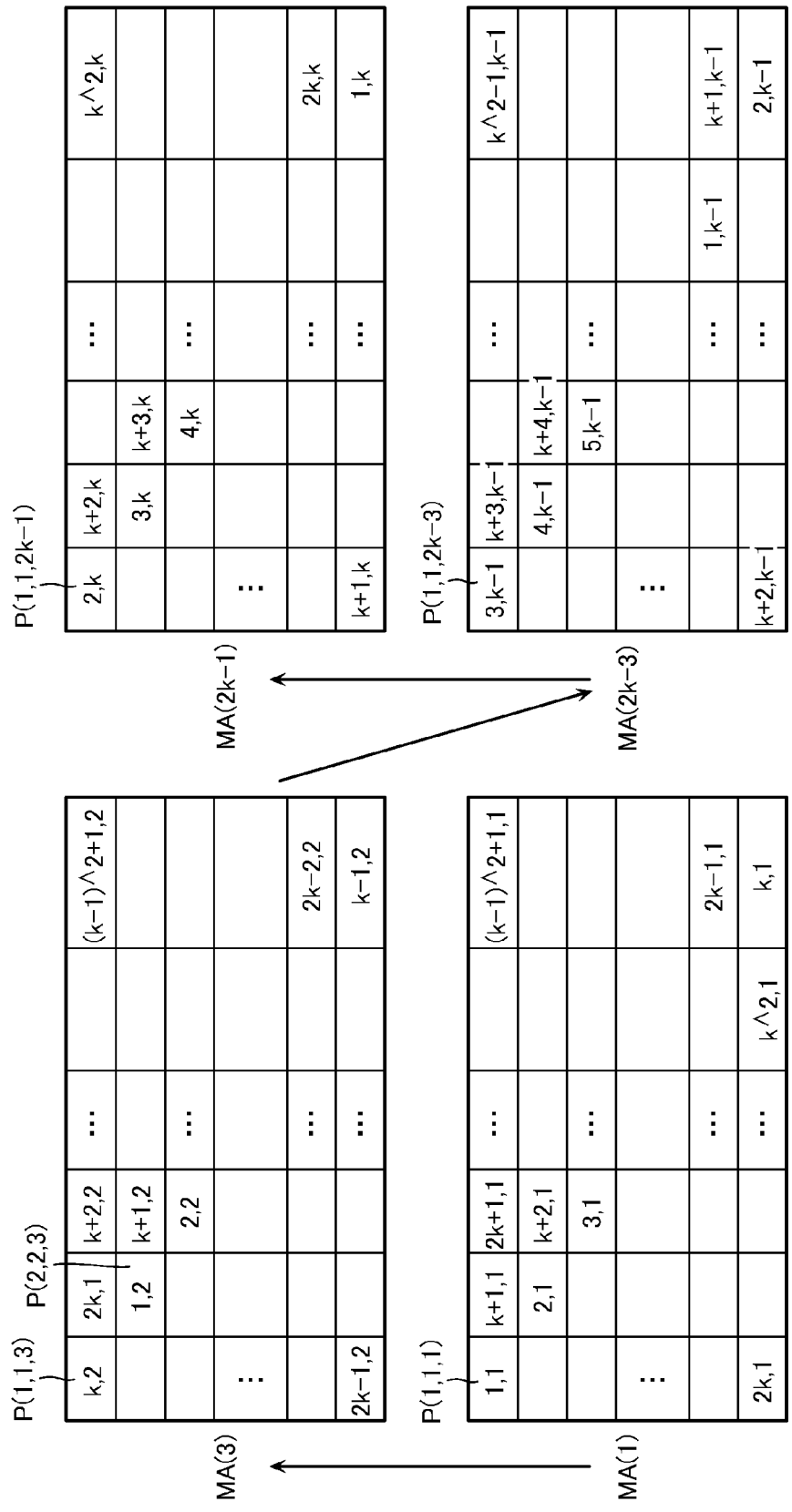
FIG. 13D is a conceptual diagram showing an example of allocation of a logical address in the nonvolatile semiconductor memory device according to the fifth embodiment.

FIG. 13D is a conceptual diagram showing an example of allocation of the logical address shown in FIGS. 13B and 13C. This example shows the case where 2k−1 layers of the memory layers MA are disposed in the memory cell array, and k×k memory cells exist in one memory layer MA. In the case of this example, making a selection of the logical addresses such as L(1,1), L(1,2), L(1,3), . . . , L(2,1), L(2,2), L(2,3), . . . results in the selected memory cell shifting in an oblique direction as viewed from the XY planar surface, while shifting in the Z direction.

For example, k pieces of data are assumed to be one page. Then, data from external having a data length of k is inputted from a host or the like, and the control circuit executes the setting operation or resetting operation according to an order of numerical value of the logical address ((1,1), (1,2), (1,3), (1,4), . . . , (1, k)), thereby storing the data in respective memory cells. The next one-page data having a data length of n is inputted from the host or the like, and the control circuit executes the setting operation or resetting operation according to an order of numerical value of the logical address ((2,1), (2,2), (2,3), (2,4), . . . , (2, k)), thereby storing the data in respective memory cells.

In this way, the present embodiment adopts a selection method that selects the stacked plurality of memory layers sequentially in the stacking direction. In selection of the memory layer, a memory layer not sharing bit lines BL or word lines WL with the currently selected memory layer is next selected, by, for example, skipping one memory layer (in other words, the newly selected memory layer includes bit lines and word lines different from the bit lines and word lines included in the currently selected memory layer). Because the consecutively selected memory layers do not share bit lines or word lines, it is possible to, for example, start a charging operation on the bit lines BL and word lines WL in the memory layer MA(3), while performing the setting operation on the memory layer MA(1). Therefore, this embodiment enables speeding-up of the operation to be achieved. Note that the first through fourth embodiments may also be appropriately combined with this fifth embodiment.

Furthermore, the memory cell can be selected in an oblique direction of the XYZ axes when viewed in three dimensions. As a result, a distance between the selected memory cell and the next selected memory cell can be increased. Accordingly, a mistaken write to the memory cell can be reduced.

Sixth Embodiment

Figure 14:
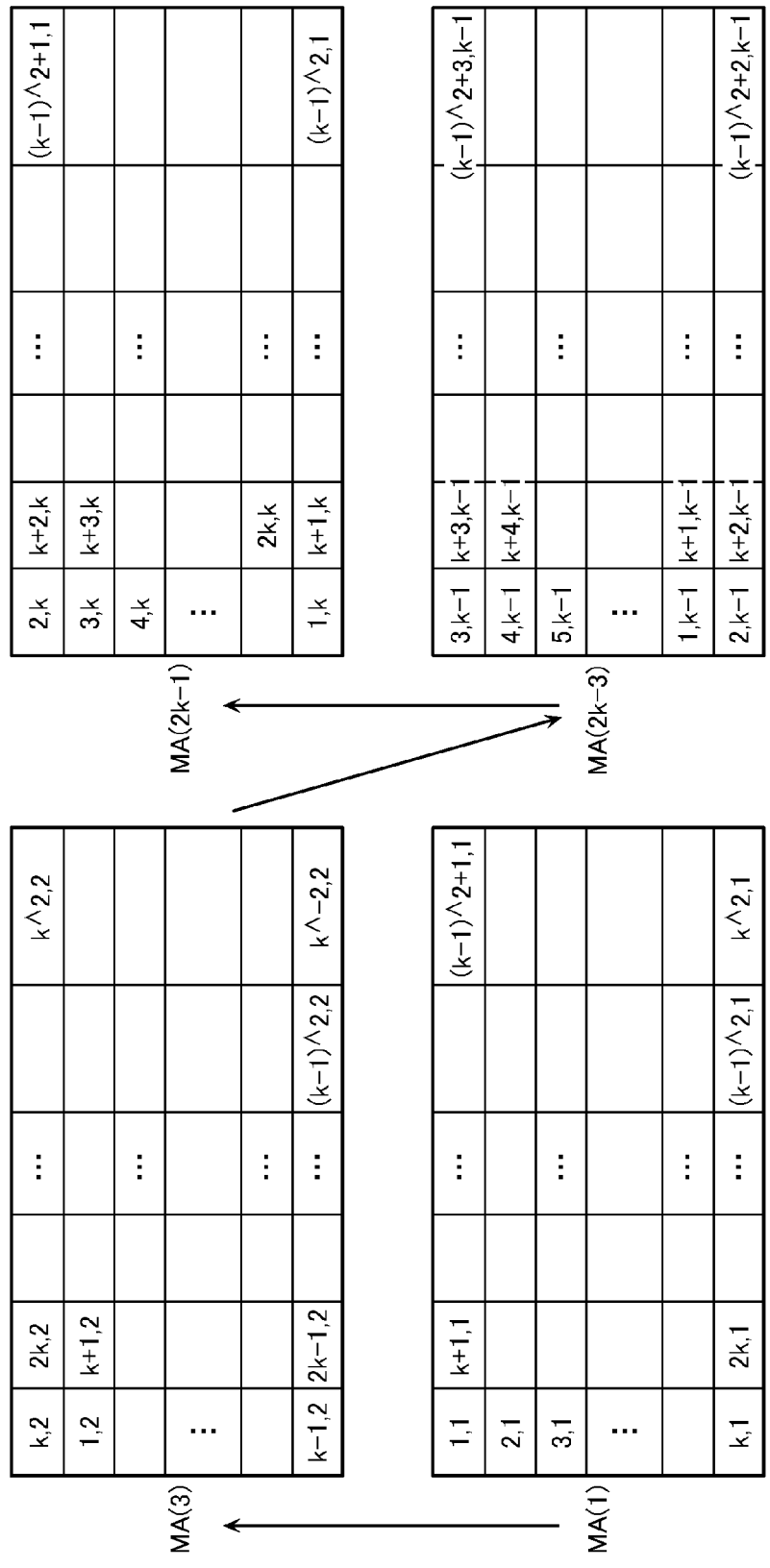
FIG. 14 is a conceptual diagram showing an example of allocation of a logical address in a nonvolatile semiconductor memory device according to a sixth embodiment.

Next, a semiconductor memory device according to a sixth embodiment will be described with reference to FIG. 14. A schematic configuration of the semiconductor memory device is substantially similar to that of the first embodiment (FIG. 1). Moreover, in the sixth embodiment, similarly to in the fifth embodiment, the memory cell array 1 is assumed to include a plurality of memory layers MA by a stacked structure of the kind shown in FIG. 13A, for example. Furthermore, in this sixth embodiment, similarly to in the fifth embodiment, the control circuit is configured to select a certain memory cell in, for example, the memory layer MA(1) and, after the setting operation or resetting operation on that memory cell has been completed, select a memory cell in a different memory layer MA (for example, the memory layer MA(3)) in the next setting operation and resetting operation.

The difference with the fifth embodiment is a method of allocation of the logical address. That is, according to a method of allocation of the logical address shown in FIG. 14, when selection of the logical address is made in an order of L(1,1), L(1,2), L(1,3), . . . , L(2,1), L(2,2), L(2,3), . . . , the selected memory cell shifts in a YZ planar surface (does not shift in the X axis direction). Moreover, when the selected memory cell has reached an end in the Y direction, the X coordinate too is incremented, and thereafter the memory cell is selected in a similar manner.

This embodiment enables similar advantages to those of the fifth embodiment to be obtained.

Seventh Embodiment

Next, a semiconductor memory device according to a seventh embodiment will be described with reference to FIGS. 15A~16. A schematic configuration of the semiconductor memory device is substantially similar to that of the first embodiment (FIG. 1). However, in this embodiment, the memory cell array 1 comprises a form of the kind shown in FIGS. 15A~15C.

Figure 15A:
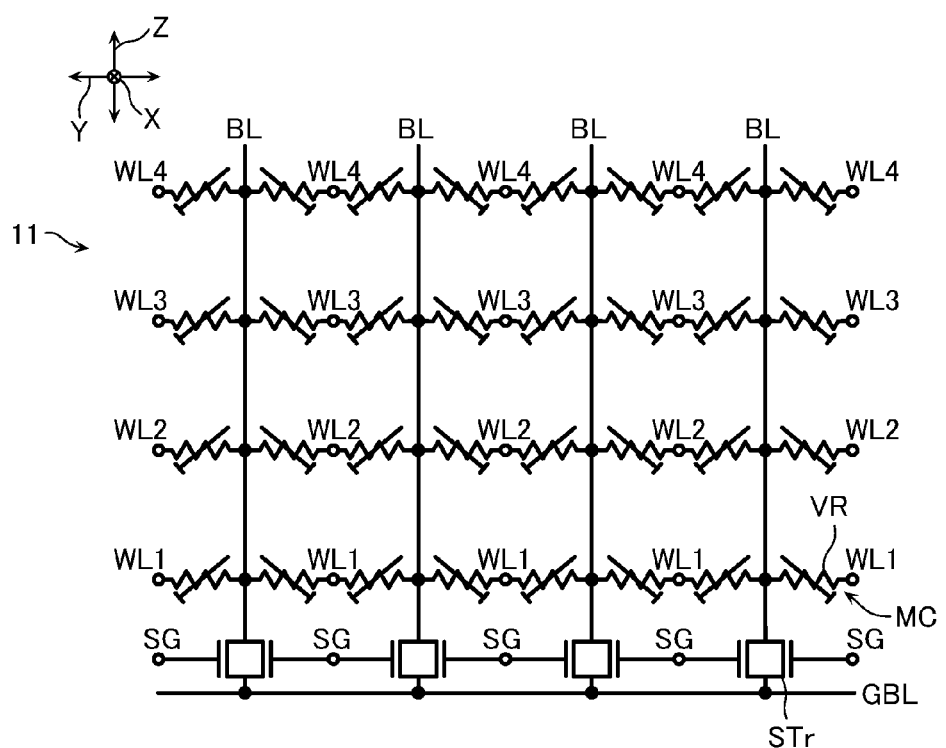
FIG. 15A is an example of a circuit diagram of a memory cell array according to a seventh embodiment.
Figure 15B:
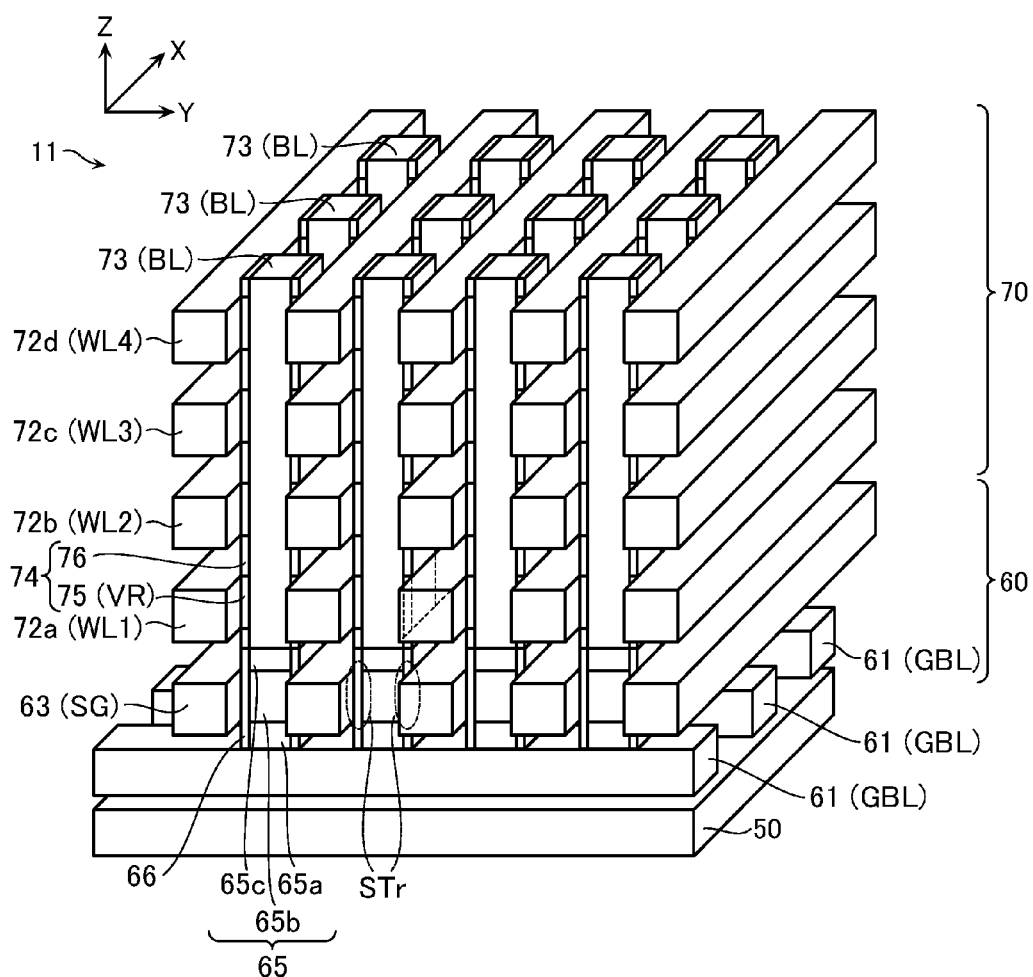
FIG. 15B is an example of a perspective view showing a stacked structure of the memory cell array according to the seventh embodiment.
Figure 15C:
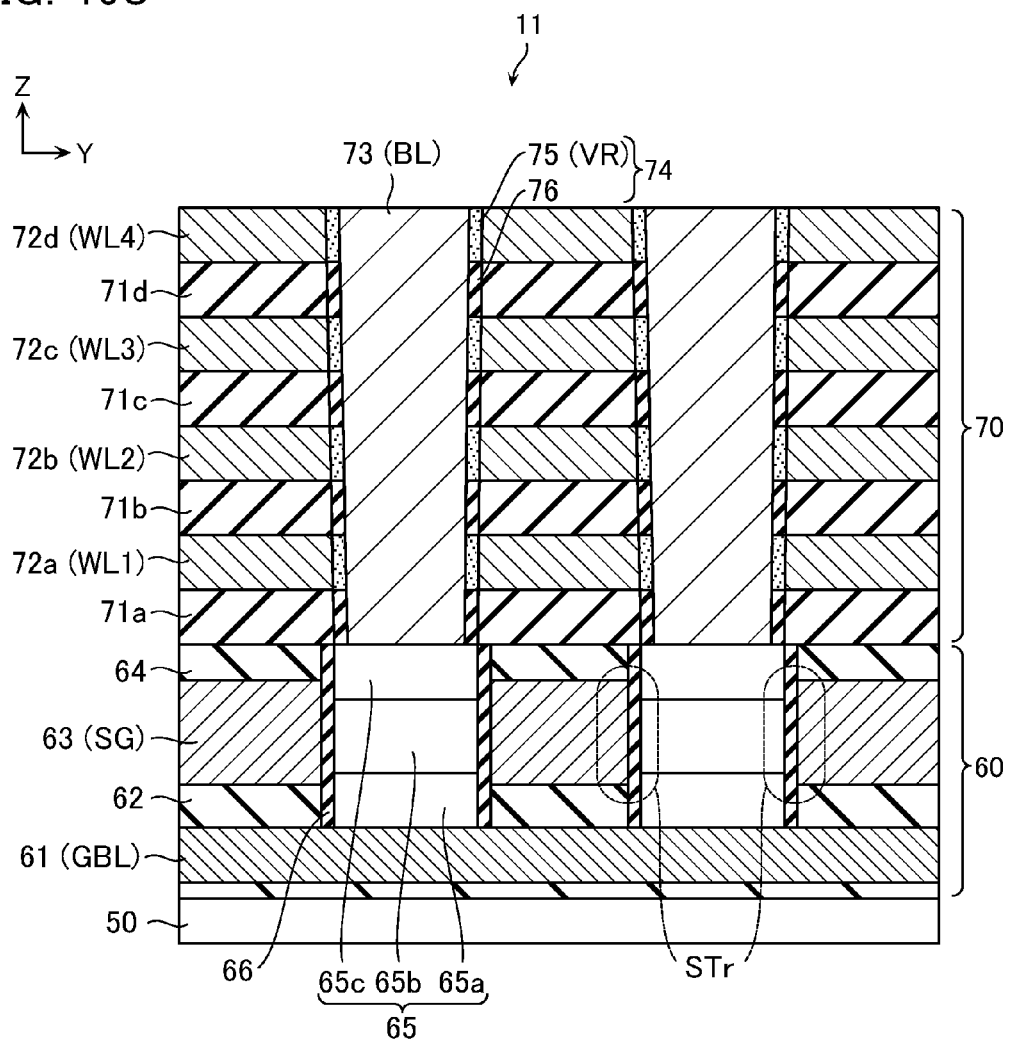
FIG. 15C is an example of a cross-sectional view of FIG. 15B.

As shown in FIGS. 15A~15C, the semiconductor memory device according to this seventh embodiment includes a memory cell array 11 different to that of the first embodiment. The bit line BL is disposed extending in a vertical direction.

First, a circuit configuration of the memory cell array 11 according to the seventh embodiment will be described with reference to FIG. 15A. FIG. 15A is an example of a circuit diagram of the memory cell array 11. Note that in FIG. 15A, an X direction, a Y direction, and a Z direction are mutually orthogonal, and the X direction is a direction perpendicular to the plane of paper. Moreover, a structure shown in FIG. 15A is provided repeatedly in the X direction.

As shown in FIG. 15A, the memory cell array 11 according to the seventh embodiment includes a select transistor STr, a global bit line GBL, and a select gate line SG, in addition to the above-mentioned word line WL, bit line BL, and memory cell MC.

As shown in FIG. 15A, the word lines WL1~WL4 are arranged in the Z direction and extend in the X direction. The bit lines BL are arranged in a matrix in the X direction and the Y direction, and extend in the Z direction. The memory cells MC are disposed at places where these word lines WL and bit lines BL intersect. Therefore, the memory cells MC are arranged in a three-dimensional matrix in the X, Y, and Z directions.

As shown in FIG. 15A, the select transistor STr is provided between the global bit line GBL and an end of the bit line BL. The global bit lines GBL are aligned in the X direction and extend in the Y direction. One global bit line GBL is commonly connected to one ends of a plurality of the select transistors STr arranged in a line in the Y direction. In other words, the bit lines BL disposed in the Y direction could be said to be connected to one global bit line GBL. The select gate lines SG are aligned in the Y direction and extend in the X direction. One select gate line SG is commonly connected to gates of a plurality of the select transistors STr arranged in a line in the X direction.

Next, a stacked structure of the memory cell array 11 according to the seventh embodiment will be described with reference to FIGS. 15B and 15C. FIG. 15B is an example of a perspective view showing the stacked structure of the memory cell array 11. FIG. 15C is an example of a cross-sectional view of FIG. 15B. Note that in FIG. 15B, an inter-layer insulating layer is omitted.

As shown in FIGS. 15B and 15C, the memory cell array 11 includes a select transistor layer 60 and a memory layer 70, stacked on a substrate 50. A plurality of the select transistors STr are disposed in the select transistor layer 60, and a plurality of the memory cells MC are disposed in the memory layer 70.

As shown in FIGS. 15B and 15C, the select transistor layer 60 includes a conductive layer 61, an inter-layer insulating layer 62, a conductive layer 63, and an inter-layer insulating layer 64 that are stacked in the Z direction perpendicular to the principal planar surface of the substrate 50. The conductive layer 61 functions as the global bit line GBL, and the conductive layer 63 functions as the select gate line SG and as the gate of the select transistor STr.

The conductive layers 61 are aligned with a certain pitch in the X direction parallel to the principal planar surface of the substrate 50, and extend in the Y direction. The inter-layer insulating layer 62 covers an upper surface of the conductive layer 61. The conductive layers 63 are aligned with a certain pitch in the Y direction, and extend in the X direction. The inter-layer insulating layer 64 covers a side surface and an upper surface of the conductive layer 63. The conductive layers 61 and 63 are configured by, for example, polysilicon. The inter-layer insulating layers 62 and 64 are configured by, for example, silicon oxide ($SiO_2$).

In addition, the select transistor layer 60 includes a columnar semiconductor layer 65 and a gate insulating layer 66. The columnar semiconductor layer 65 functions as a body (channel) of the select transistor STr, and the gate insulating layer 66 functions as a gate insulating film of the select transistor STr.

The columnar semiconductor layers 65 are disposed in a matrix in the X and Y directions, and extend in a column shape in the Z direction. In addition, the columnar semiconductor layer 65 contacts an upper surface of the conductive layer 61 and contacts a side surface of an end in the Y direction of the conductive layer 63, via the gate insulating layer 66. Moreover, the columnar semiconductor layer 65 includes, for example, an N+ type semiconductor layer 65a, a P+ type semiconductor layer 65b, and an N+ type semiconductor layer 65c that are stacked.

The N+ type semiconductor layer 65a contacts the inter-layer insulating layer 62 at a side surface of an end in the Y direction of the N+ type semiconductor layer 65a. The P+ type semiconductor layer 65b contacts a side surface of the conductive layer 63 at a side surface of an end in the Y direction of the P+ type semiconductor layer 65b. The N+ type semiconductor layer 65c contacts the inter-layer insulating layer 64 at a side surface of an end in the Y direction of the N+ type semiconductor layer 65c. The N+ type semiconductor layers 65a and 65c are configured by polysilicon implanted with an N+ type impurity, and the P+ type semiconductor layer 65b is configured by polysilicon implanted with a P+ type impurity. The gate insulating layer 66 is configured by, for example, silicon oxide ($SiO_2$).

The memory layer 70 includes, stacked alternately in the Z direction, inter-layer insulating layers 71a~71d and conductive layers 72a~72d. The conductive layers 72a~72d function as the word lines WL1~WL4. The conductive layers 72a~72d each include a pair of comb tooth shapes facing each other in the X direction. The inter-layer insulating layers 71a~71d are configured by, for example, silicon oxide ($SiO_2$), and the conductive layers 72a~72d are configured by, for example, polysilicon.

In addition, the memory layer 70 includes a columnar conductive layer 73 and a sidewall layer 74. The columnar conductive layers 73 are disposed in a matrix in the X and Y directions, and extend in a column shape in the Z direction as well as contacting an upper surface of the columnar semiconductor layer 65. The columnar conductive layer 73 functions as the bit line BL.

The sidewall layer 74 is provided at a side surface of an end in the Y direction of the columnar conductive layer 73. The sidewall layer 74 includes a variable resistance layer 75 and an oxide layer 76. The variable resistance layer 75 functions as the variable resistance element VR. The oxide layer 76 has a conductivity lower than that of the variable resistance layer 75.

The variable resistance layer 75 is provided between the columnar conductive layer 73 and a side surface of an end in the Y direction of the conductive layers 72a~72d. The oxide layer 76 is provided between the columnar conductive layer 73 and a side surface of an end in the Y direction of the inter-layer insulating layers 71a~71d.

The columnar conductive layer 73 is configured by, for example, polysilicon, and the sidewall layer 74 (variable resistance layer 75 and oxide layer 76) is configured by, for example, a metal oxide.

In this memory cell array having the structure shown in FIGS. 15A~15C, there are two memory cells disposed in the same layer with respect to one bit line BL. Moreover, since the bit line BL is formed of a semiconductor (for example, polysilicon), residual carriers sometimes remain for a comparatively long time.

Therefore, in this embodiment, when the memory cells are sequentially selected, the select transistor STr is ON/OFF controlled, whereby the read-target bit line is sequentially changed (memory cells along the same bit line are not consecutively adopted as the read target).

Figure 16:
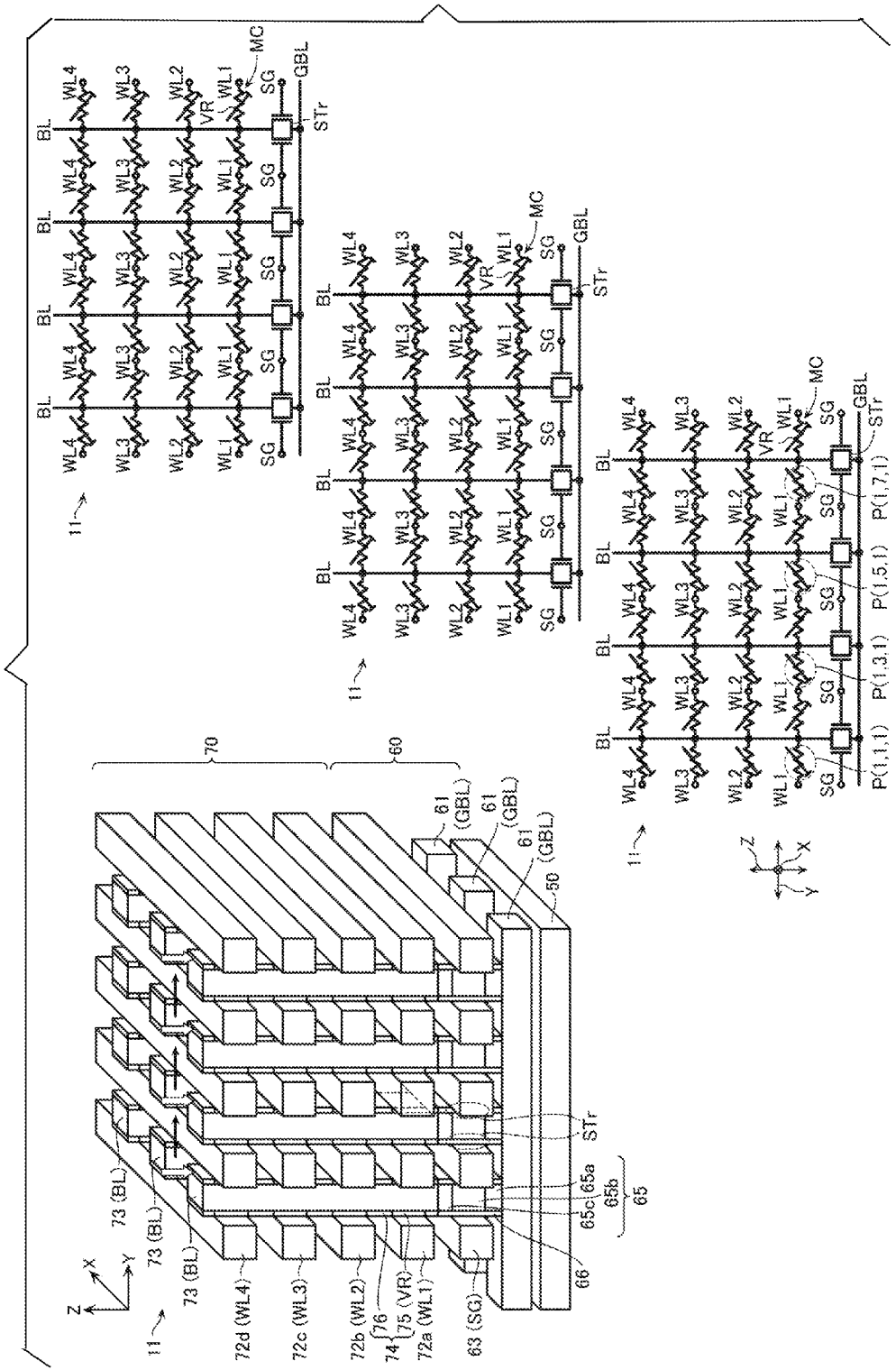
FIGS. 16–19 are examples of a selection order of a memory cell in the nonvolatile semiconductor memory device according to the seventh embodiment.

Now, FIG. 16 shows an example of allocation of the physical address of the memory cell and an example of selection order of the memory cell in FIGS. 15A~15C. As shown in a circuit diagram on the right-hand side of FIG. 16, the foremost bottom left memory cell is assumed to be P(1,1,1). With reference to the memory cell having the physical address P(1,1,1), the X address increases as one proceeds deeper in the X axis direction in the plane of paper, the Y address increases as one proceeds further to the right in the Y direction in the plane of paper, and the Z address increases as one proceeds further upward in the Z axis direction in the plane of paper. Now, FIG. 16 shows an example where 16 bit lines are disposed 4×4, and four layers of word lines WL are stacked.

Figure 17:
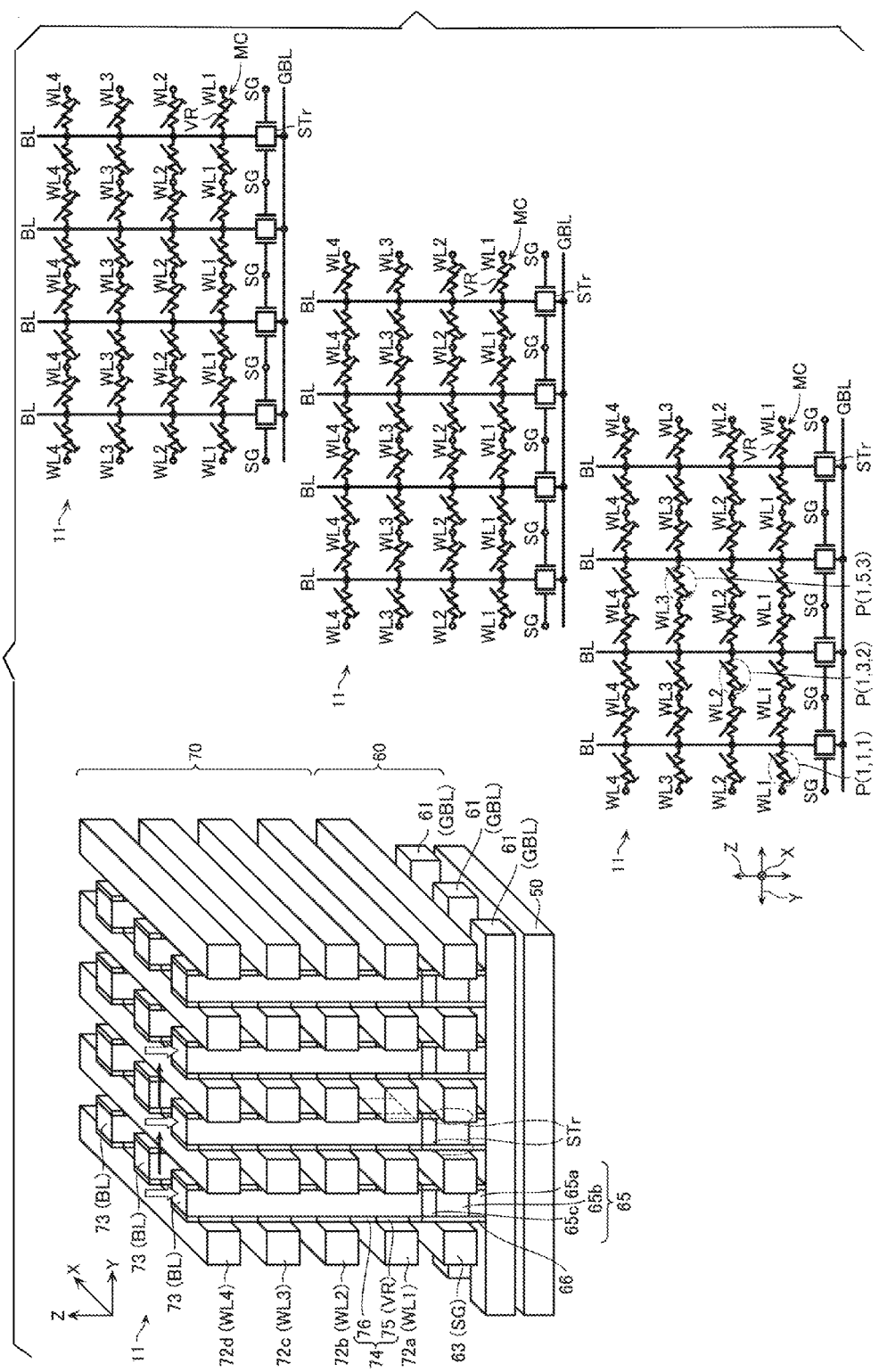

Next, selection of the memory cells will be described. For example, as shown in FIG. 16, after selecting the memory cell having the physical address P(1,1,1), next, the memory cell having the physical address P(1,3,1) which does not share a bit line BL with this memory cell having the physical address P(1,1,1), is selected. Thereafter, the memory cells having the physical address P(1,5,1) and the physical address P(1,7,1) are sequentially selected in a similar manner. This FIG. 16 shows the case where memory cells connected to the same word line WL (memory cells having the same Z coordinate) are sequentially selected, and the X coordinate is not changed either. In this seventh embodiment, it could be said that the selected bit line BL is being sequentially changed. Therefore, in FIG. 16, in order to inhibit effects being received from the residual charge and so on in the select gate line and bit line, memory cells having a Y coordinate that differs by two are sequentially selected as described above. Moreover, as shown in FIG. 17, it is also possible for the Z coordinate of the sequentially selected memory cell to be sequentially changed (for example, increased one at a time). Sometimes, a plurality of word lines WL are shared by the same memory layer. As a result, changing the layer of the selected word line WL makes it possible to prevent effects being received from the residual charge and so on in the word line.

Figure 18:
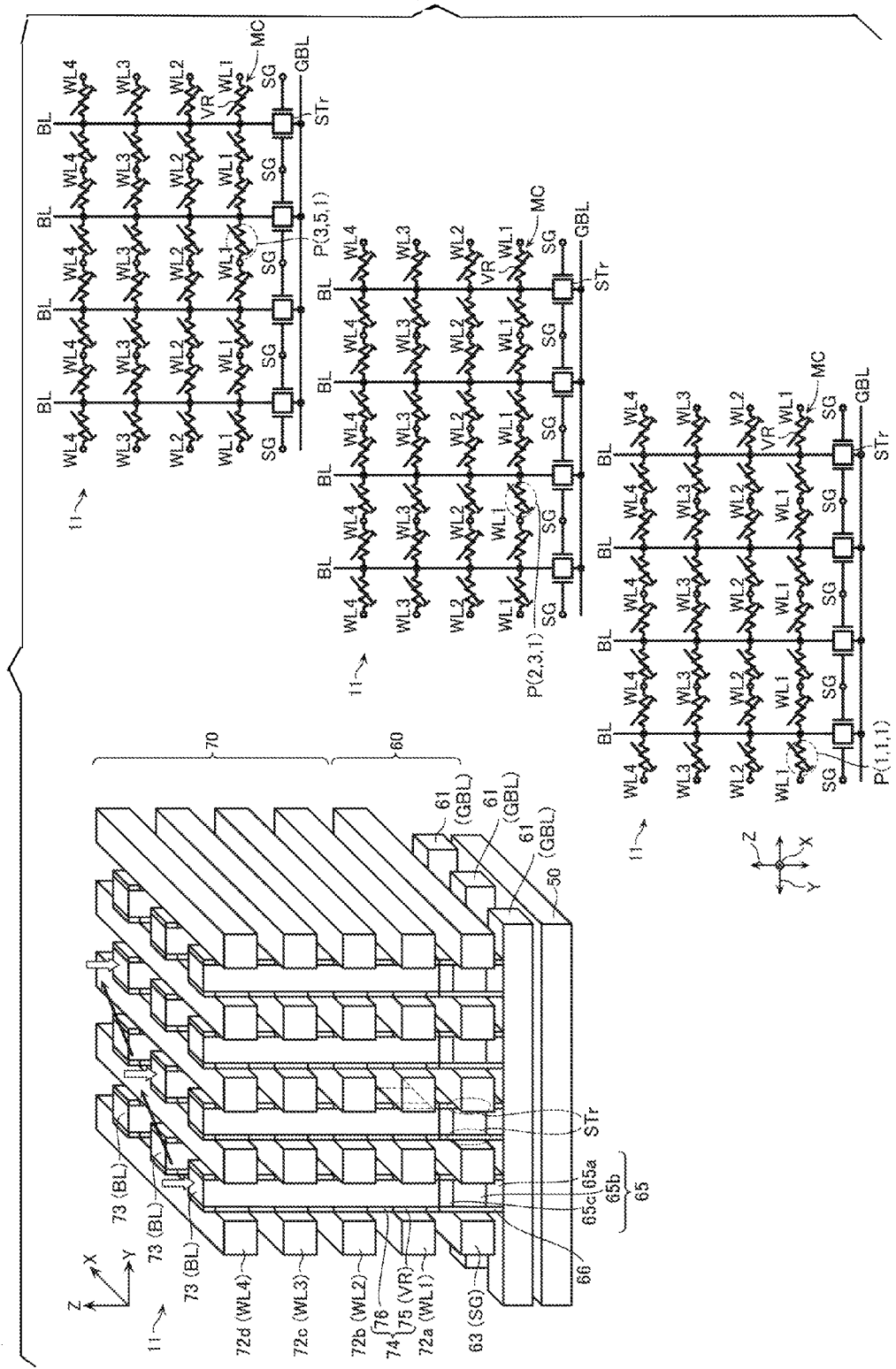

FIG. 18 is a conceptual diagram showing a separate selection procedure. The example of this FIG. 18 shows the case where, when sequentially selecting the memory cells, the Z coordinate only is fixed, the X coordinate is changed one at a time, and the Y coordinate is changed two at a time (P(1,1,1)→P(2,3,1)→P(3,5,1)→ . . . ). It could be said that as a result, the selected global bit line GBL is being sequentially changed. This makes it possible to prevent effects being received from the residual charge and so on in the global bit line GBL.

Figure 19:
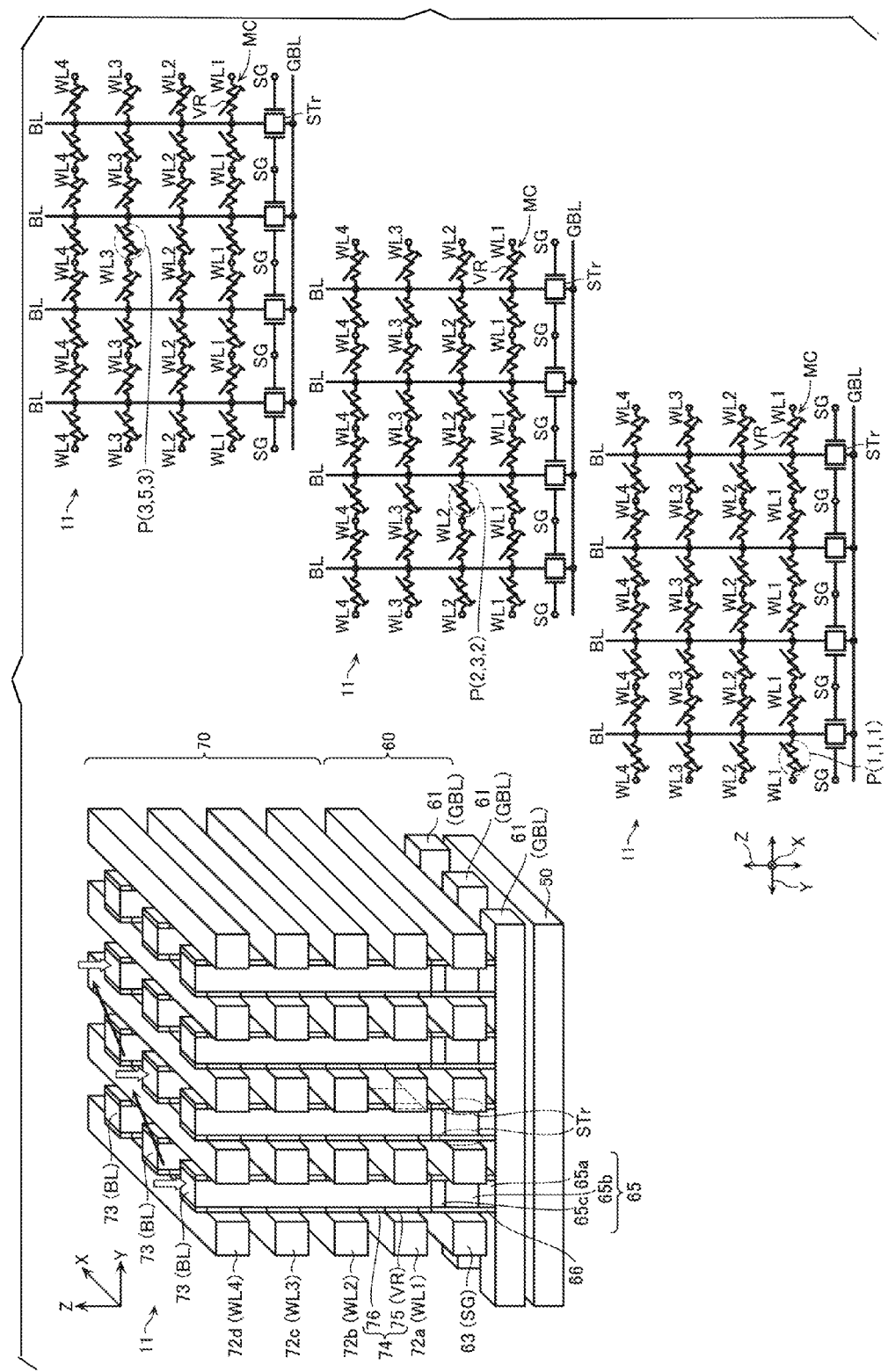

In addition, as shown in FIG. 19, it is also possible to adopt a selection procedure where the Z coordinate too increases one at a time (P(1,1,1)→P(2,3,2)→P(3,5,3)→ . . . ). Changing all of the X, Y, and Z coordinates allows effects of the residual charge and so on to be further reduced.

Moreover, allocation of the logical address can be performed similarly to in the sixth embodiment.

Similar advantages to those of the first through sixth embodiments are obtained also in the seventh embodiment.

Material of Memory Cell Array

Finally, a summary is provided of a material employed in the memory cell array according to the first through seventh embodiments. Note that x and y express an arbitrary composition ratio.

<Rectifier Element>

A material of the p type semiconductor, n type semiconductor, and intrinsic semiconductor configuring the rectifier element acting as the non-ohmic element can be selected from the group of semiconductors such as Si, SiGe, SiC, Ge, C, and so on.

Used in the junction portion with the upper semiconductor configuring the rectifier element is a silicide made of Si, Ti, V, Cr, Mn, Fe, Co, Ni, Cu, Zn, Rh, Pd, Ag, Cd, In, Sn, La, Hf, Ta, W, Re, Os, Ir, Pt, or Au. Added to these silicides are one, or two or more of Sc, Ti, V, Cr, Mn, Fe, Co, Ni, Cu, Y, Zr, Nb, Mo, Tc, Ru, Rh, Pd, Ag, Cd, In, Sn, La, Hf, Ta, W, Re, Os, Ir, Pt, and Au.

When an insulating layer is included in the rectifier element, that insulating layer is selected from materials below, for example.

(1) Oxide $SiO_2$, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, AlSiO $AM_2O_4$
where A and M are the same or different elements and are each one of Al, Sc, Ti, V, Cr, Mn, Fe, Co, Ni, Cu, Zn, Ga, and Ge.

$AM_2O_4$ includes, for example, $Fe_3O_4$, $FeAl_2O_4$, $Mn_{1+x}Al_{2-x}O_{4+y}$, $CO_{1+x}Al_{2-x}O_{4+y}$, $MnO_x$, and so on.

$AMO_3$
where A and M are the same or different elements and are each one of Al, La, Hf, Ta, W, Re, Os, Ir, Pt, Au, Hg, Tl, Pb, Bi, Ce, Pr, Nd, Pm, Sm, Eu, Gd, Tb, Dy, Ho, Er, Tm, Yb, Lu, Sc, Ti, V, Cr, Mn, Fe, Co, Ni, Cu, Zn, Ga, Ge, Y, Zr, Nb, Mo, Tc, Ru, Rh, Pd, Ag, Cd, In, and Sn.

$AMO_3$ includes, for example, $LaAlO_3$, $SrHfO_3$, $SrZrO_3$, $SrTiO_3$, and so on.

(2) Oxynitride

SiON, AlON, YON, LaON, GdON, CeON, TaON, HfON, ZrON, TiON, LaAlON, SrHfON, SrZrON, SrTiON, HfSiON, HfAlON, ZrSiON, ZrAlON, AlSiON a material having a portion of the oxygen element of the oxides indicated in (1) above replaced by a nitrogen element.

Specifically, the insulating layers configuring the rectifier element are each preferably selected from the group of $SiO_2$, SiN, $Si_3N_4$, $Al_2O_3$, SiON, $HfO_2$, HfSiON, $Ta_2O_5$, $TiO_2$, and $SrTiO_3$.

Note that an insulating film of a Si system such as $SiO_2$, SiN, SiON, and so on, includes an insulating film where concentrations of the oxygen element and the nitrogen element are each $1 \times 10^{18}$ atoms/cm$^3$ or more.

However, barrier heights of the plurality of insulating layers differ from each other.

Moreover, the insulating layer also includes a material including an impurity atom forming a defect level, or a semiconductor/metal dot (quantum dot).

<Variable Resistance Element>

The variable resistance element of the memory cell MC or a memory layer in the case of a memory function being incorporated in the rectifier element of the memory cell MC includes materials below, for example.

(1) Oxide $SiO_2$, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, AlSiO $AM_2O_4$ where A and M are the same or different elements and are each one of Al, Sc, Ti, V, Cr, Mn, Fe, Co, Ni, Cu, Zn, Ga, and Ge.

$AM_2O_4$ includes, for example, $Fe_3O_4$, $FeAl_2O_4$, $Mn_{1+x}Al_{2-x}O_{4+y}$, $CO_{1+x}Al_{2-x}O_{4+y}$, $MnO_x$, and so on.

$AMO_3$ where A and M are the same or different elements and are each one of or a combination of a plurality of Al, La, Hf, Ta, W, Re, Os, Ir, Pt, Au, Hg, Tl, Pb, Bi, Ce, Pr, Nd, Pm, Sm, Eu, Gd, Tb, Dy, Ho, Er, Tm, Yb, Lu, Sc, Ti, V, Cr, Mn, Fe, Co, Ni, Cu, Zn, Ga, Ge, Y, Zr, Nb, Mo, Tc, Ru, Rh, Pd, Ag, Cd, In, and Sn.

$AMO_3$ includes, for example, $LaAlO_3$, $SrHfO_3$, $SrZrO_3$, $SrTiO_3$, and so on.

(2) Oxynitride

SiON, AlON, YON, LaON, GdON, CeON, TaON, HfON, ZrON, TiON, LaAlON, SrHfON, SrZrON, SrTiON, HfSiON, HfAlON, ZrSiON, ZrAlON, AlSiON

The memory element is configured from, for example, a binary-system or ternary-system metal oxide or organic material (including a single layer film or nanotube). For example, if carbon (in the case of carbon), it includes a two-dimensional structure of a single layer film, a nanotube, graphene, fullerene, and so on. The metal oxide includes the oxide indicated in (1) above or the oxynitride indicated in (2) above.

<Electrode Layer>

The electrode layer employed in the memory cell MC may include a single metal element or a composite of a plurality of metal elements, a silicide or an oxide, a nitride, and so on.

Specifically, the electrode layer is configured from the likes of Pt, Au, Ag, TiAlN, SrRuO, Ru, RuN, Ir, Ti, V, Cr, Mn, Fe, Co, Ni, Cu, TiN, TaN, LaNiO, Al, $PtIrO_x$, $PtRhO_x$, Rh, TaAlN, $SiTiO_x$, $WSi_x$, $TaSi_x$, $PdSi_x$, $PtSi_x$, $IrSi_x$, $ErSi_x$, $YSi_x$, $HfSi_x$, $NiSi_x$, $CoSi_x$, $TiSi_x$, $VSi_x$, $CrSi_x$, $MnSi_x$, and $FeSi_x$.

The electrode layer may simultaneously function as a barrier metal layer or an adhesive layer.

<Word Line WL and Bit Line BL>

The conductive line functioning as the word line WL and the bit line BL of the memory cell array 1 is configured from the likes of W, WN, Al, Ti, V, Cr, Mn, Fe, Co, Ni, Cu, TiN, $WSi_x$, $TaSi_x$, $PdSi_x$, $ErSi_x$, $YSi_x$, $PtSi_x$, $HfSi_x$, $NiSi_x$, $CoSi_x$, $TiSi_x$, $VSi_x$, $CrSi_x$, $MnSi_x$, and $FeSi_x$.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a memory cell array including a plurality of bit lines extending in a stacking direction as a longer direction and being arranged in a first direction and a second direction that intersect the stacking direction, a plurality of word lines extending in the first direction and stacked in the stacking direction, and memory cells provided at intersections of the plurality of bit lines and the plurality of word lines; and
a control unit configured to control a voltage applied to one of the bit lines and one of the word lines,
wherein each memory cell includes a variable resistance element, and
wherein, when performing a first operation and a subsequent second operation on a plurality of the memory cells, the control unit is configured to select a first bit line from among the plurality of bit lines and a first word line from among the plurality of word lines to perform the first operation on a first memory cell, and then, in the subsequent second operation following the first operation, the control unit is configured to select a second bit line that is adjacent to the first bit line in a diagonal direction with respect to the first direction and the second direction, and a second word line that is adjacent to the first word line in the stacking direction.

2. The semiconductor memory device according to claim 1, further comprising:
a global bit line extending in the second direction and connected to a plurality of the bit lines arranged in the second direction, and
select transistors connected between the global bit line and the plurality of the bit lines.

3. The semiconductor memory device according to claim 1, wherein the control unit is configured to change the selected bit line and sequentially change the selected word line in the first direction and the second direction.

4. A semiconductor memory device, comprising:
a memory cell array including a plurality of bit lines extending in a stacking direction as a longer direction and being arranged in a first direction and a second direction that intersect the stacking direction, a plurality of word lines extending in the first direction and stacked in the stacking direction, and memory cells provided at intersections of the plurality of bit lines and the plurality of word lines; and
a control unit configured to control a voltage applied to one of the bit lines and one of the word lines,
wherein each memory cell includes a variable resistance element, and
wherein, where (i) a memory cell provided at an intersection between a first word line and a first bit line is defined as a first memory cell, (ii) a memory cell provided at an intersection between a second word line and the first bit line is defined as a second memory cell, the second word line being adjacent to the first word line in the second direction, (iii) a memory cell provided at an intersection between the second word line and a second bit line is defined as a third memory cell, the second bit line being adjacent to the first bit line in the second direction, with the second memory cell and the second word line located therebetween, (iv) a memory cell provided at an intersection between the second word line and a third bit line is defined as a fourth memory cell, the third bit line being adjacent to the second bit line in the first direction, and (v) a memory cell provided at an intersection between a third word line and the third bit line is defined as a fifth memory cell, the third word line being adjacent to the second word line in the stacking direction, the control unit is configured to select the first memory cell in a first operation, and select the fifth memory cell in a second operation subsequent to the first operation.

5. The semiconductor memory device according to claim 4, further comprising:
a global bit line extending in the second direction and connected to a plurality of the bit lines arranged in the second direction, and
select transistors connected between the global bit line and the plurality of the bit lines.

6. The semiconductor memory device according to claim 4, wherein the control unit is configured to change the selected bit line and sequentially change the selected word line in the first direction and the second direction.

7. A semiconductor memory device, comprising:
a memory cell array including a plurality of bit lines extending in a stacking direction as a longer direction and being arranged in a first direction and a second direction that intersect the stacking direction, a plurality of word lines extending in the first direction and stacked in the stacking direction, and memory cells provided at intersections of the plurality of bit lines and the plurality of word lines; and
a control unit configured to control a voltage applied to one of the bit lines and one of the word lines,
wherein each memory cell includes a variable resistance element,
wherein (i) a memory cell provided at an intersection between a first word line and a first bit line is defined as a first memory cell, (ii) a memory cell provided at an intersection between a second word line and the first bit line is defined as a second memory cell, the second word line being adjacent to the first word line in the second direction, (iii) a memory cell provided at an intersection between a third word line and the first bit line is defined as a third memory cell, the third word line being above or below the first word line in the stacking direction, and (iv) a memory cell provided at an intersection between a fourth word line and the first bit line is defined as a fourth memory cell, the fourth word line being above or below the second word line in the stacking direction, and
wherein, when selecting the first memory cell in a first operation, the control unit is configured to cause the second memory cell, the third memory cell, and the fourth memory cell to be unselected in a second operation subsequent to the first operation.

8. The semiconductor memory device according to claim 7, further comprising:
a global bit line extending in the second direction and connected to a plurality of the bit lines arranged in the second direction, and
select transistors connected between the global bit line and the plurality of the bit lines.

9. The semiconductor memory device according to claim 7, wherein the control unit is configured to select different word lines in the first operation and the second operation.

10. The semiconductor memory device according to claim 7, wherein the control unit is configured to change the selected bit line in the first direction and the second direction, in the first operation and the second operation.

11. The semiconductor memory device according to claim 10, wherein the control unit is configured to sequentially change the selected word line in the first operation and the second operation.

* * * * *